(12) United States Patent
Kozuma et al.

(10) Patent No.: US 8,716,712 B2
(45) Date of Patent: May 6, 2014

(54) SEMICONDUCTOR DEVICE

(75) Inventors: Munehiro Kozuma, Isehara (JP);
Yoshiyuki Kurokawa, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/027,488

(22) Filed: Feb. 15, 2011

(65) Prior Publication Data
US 2011/0204371 A1    Aug. 25, 2011

(30) Foreign Application Priority Data

Feb. 19, 2010   (JP) ................................. 2010-034173

(51) Int. Cl.
*H01L 27/146*  (2006.01)
(52) U.S. Cl.
USPC ............. 257/59; 257/444; 257/448; 257/458; 257/461; 257/614; 257/615
(58) Field of Classification Search
CPC .................... H01L 27/14603; H01L 27/14609
USPC ........................ 257/59, 84, E27.133; 345/175
See application file for complete search history.

(56) References Cited

U.S. PATENT DOCUMENTS

| | | | |
|---|---|---|---|
| 5,043,785 A | 8/1991 | Mizutani et al. | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,433,373 B1 | 8/2002 | Lee et al. | |
| 6,563,174 B2 | 5/2003 | Kawasaki et al. | |
| 6,610,557 B2 | 8/2003 | Lee et al. | |
| 6,727,522 B1 | 4/2004 | Kawasaki et al. | |
| 6,747,638 B2 | 6/2004 | Yamazaki et al. | |
| 7,049,190 B2 | 5/2006 | Takeda et al. | |
| 7,061,014 B2 | 6/2006 | Hosono et al. | |

(Continued)

FOREIGN PATENT DOCUMENTS

| EP | 0304335 A | 2/1989 |
|---|---|---|
| EP | 1737044 A | 12/2006 |

(Continued)

OTHER PUBLICATIONS

Jeon et al., "180 nm Gate Length Amorphous InGaZnO Thin Film Transistor for High Density Image Sensor Applications," IEDM 10, pp. 504-507 (2010).

(Continued)

*Primary Examiner* — Olik Chaudhuri
*Assistant Examiner* — Christine Enad
(74) *Attorney, Agent, or Firm* — Eric J. Robinson; Robinson Intellectual Property Law Office, P.C.

(57) ABSTRACT

An object of the invention is to improve the accuracy of light detection in a photosensor, and to increase the light-receiving area of the photosensor. The photosensor includes: a light-receiving element which converts light into an electric signal; a first transistor which transfers the electric signal; and a second transistor which amplifies the electric signal. The light-receiving element includes a silicon semiconductor, and the first transistor includes an oxide semiconductor. The light-receiving element is a lateral-junction photodiode, and an n-region or a p-region included in the light-receiving element overlaps with the first transistor.

30 Claims, 29 Drawing Sheets

(56) References Cited

U.S. PATENT DOCUMENTS

| | | |
|---|---|---|
| 7,064,346 B2 | 6/2006 | Kawasaki et al. |
| 7,105,868 B2 | 9/2006 | Nause et al. |
| 7,211,825 B2 | 5/2007 | Shih et al |
| 7,262,073 B2 | 8/2007 | Baek et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,525,523 B2 | 4/2009 | Yamazaki et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0042707 A1* | 3/2004 | Imai et al. ......................... 385/14 |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2007/0292777 A1 | 12/2007 | Melvin et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0054319 A1* | 3/2008 | Mouli ........................... 257/292 |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0142856 A1* | 6/2008 | Sato et al. ...................... 257/292 |
| 2008/0151162 A1* | 6/2008 | Lee et al. ........................ 349/116 |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0101948 A1* | 4/2009 | Park et al. ...................... 257/292 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0295769 A1 | 12/2009 | Yamazaki et al. |
| 2010/0044711 A1* | 2/2010 | Imai ............................... 257/59 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0182282 A1 | 7/2010 | Kurokawa et al. |
| 2011/0109591 A1 | 5/2011 | Kurokawa et al. |
| 2011/0109592 A1 | 5/2011 | Kurokawa et al. |
| 2011/0176038 A1 | 7/2011 | Kurokawa et al. |
| 2011/0205209 A1 | 8/2011 | Kurokawa et al. |

FOREIGN PATENT DOCUMENTS

| | | |
|---|---|---|
| EP | 2157615 A | 2/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 64-050460 A | 2/1989 |
| JP | 05-251705 A | 9/1993 |
| JP | 07-211880 A | 8/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-292276 | 10/2001 |
| JP | 2002-016243 A | 1/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-318067 A | 11/2004 |
| JP | 2006-049338 A | 2/2006 |
| JP | 2009-105381 | 5/2009 |
| JP | 2009-135186 A | 6/2009 |
| JP | 2009-206508 A | 9/2009 |
| JP | 2010-074138 A | 4/2010 |
| JP | 2011-192976 A | 9/2011 |
| WO | WO-2004/114391 | 12/2004 |
| WO | WO-2008/027392 | 3/2008 |
| WO | WO-2009/096608 | 8/2009 |
| WO | WO-2011/102183 | 8/2011 |

OTHER PUBLICATIONS

International Search Report (Application No. PCT/JP2011/051153) Dated Apr. 5, 2011.

Written Opinion (Application No. PCT/JP2011/051153) Dated Apr. 5, 2011.

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(56) References Cited

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—$ZnO$ system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3$, and $Ga_2O_3(ZnO)_m$ (m=7, 8, 9, and 16) in the $In_2O_3$—$ZnGa_2O_4$—$ZnO$ System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 84, No. 11, pp. 1993-1995.

Li.C et al., "Modulated Structures of Homologous Compounds $inMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector with Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194..

Kurokawa.Y et al., "UHF RFCPUS on Flexible and Glass Substrates for Secure RFID Systems,", Journal of Solid-State Circuits, 2008, vol. 43, No. 1, pp. 292-299.

OHara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID Interntional Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

(56) References Cited

OTHER PUBLICATIONS

OHara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel, YbFe2O4, and Yb2Fe3O7 Types of Structures for Compounds in the In2O3 and Sc2O3—A2O3—BO Systems [A;Fe, Ga, or Al; B: Mg, Mn, Fe, Nl, Cu,or Zn] at Termperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-918.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide in InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDS '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zettschrift fur Kristallographie, 2006, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors with Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 with Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR DEVICE

TECHNICAL FIELD

The technical field relates to a photosensor, a semiconductor device including the photosensor, and a driving method thereof.

BACKGROUND ART

In recent years, attention has been driven to semiconductor devices provided with light-detecting sensors (also referred to as photosensors) (see Patent Document 1).

Semiconductor devices provided with photosensors include CCD image sensors, CMOS image sensors, and the like. Such image sensors are used, for example, in electronic apparatuses like digital still cameras or cellular phones. Further, as semiconductor devices including photosensors in their display portions, touch panels and the like have been developed.

In a semiconductor device including a photosensor, light emitted from an object to be detected or external light reflected by the object to be detected is detected directly by the photosensor or condensed by an optical lens or the like and then detected.

REFERENCE

Patent Document

[Patent Document 1] Japanese Published Patent Application No. 2001-292276

DISCLOSURE OF INVENTION

An object of the present invention is to improve the accuracy of light detection in a photosensor.

It is another object to provide a new layout or structure of a circuit of a photosensor. In particular, an object of the present invention is to increase a light-receiving area.

One embodiment of the present invention is a semiconductor device including: a light-receiving element which converts light into an electric signal; a first transistor which transfers the electric signal; and a second transistor which amplifies the electric signal. The light-receiving element includes a silicon semiconductor, and the first transistor includes an oxide semiconductor.

The light-receiving element is a lateral-junction photodiode, and an n-region or a p-region included in the light-receiving element overlaps with the first transistor.

The light-receiving element is formed over the same surface as the second transistor.

A wiring formed over a light-receiving region of the light-receiving element is made of a light-transmitting material.

In this specification, the semiconductor device refers to an element having a semiconductor property, and all the object including the element. For example, a display device including a transistor is simply referred to as a semiconductor device in some cases.

In the photosensor, an oxide semiconductor is used for the first transistor which transfers an electric signal, resulting in a reduction in the leakage current of the first transistor in the off state and an improvement in the accuracy of detecting light.

Furthermore, since the n-region or the p-region included in the light-receiving element overlaps with the first transistor, the light-receiving area of the light-receiving element can be increased; accordingly, high light sensitivity can be realized and light can be detected with high accuracy.

In addition, since the wiring formed over the light-receiving region is made of a light-transmitting material, the light-receiving area can be increased; accordingly, high light sensitivity can be realized and light can be detected with high accuracy.

BEST MODE FOR CARRYING OUT THE INVENTION

Figure 1:
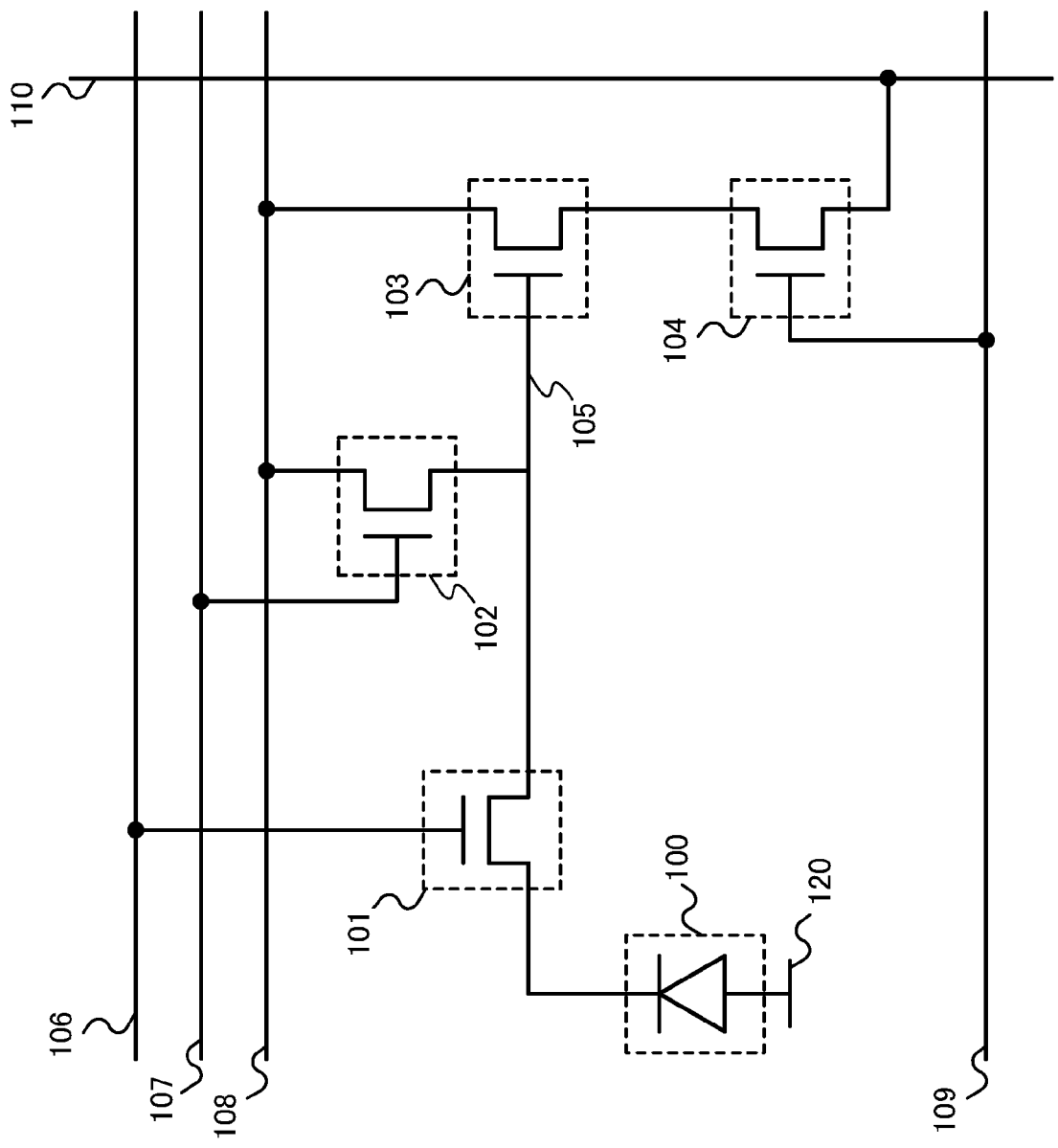
FIG. 1 illustrates an example of a circuit of a semiconductor device.

Embodiments will be described in detail below with reference to drawings. Note that the following embodiments can be implemented in many different modes, and it is apparent to those skilled in the art that modes and details can be modified in various ways without departing from the spirit and scope of the present invention. Therefore, the present invention is not construed as being limited to the description of the embodiments. Note that in all the drawings for explaining the embodiments, like portions or portions having a similar function are denoted by like reference numerals, and the description thereof is omitted.

(Embodiment 1)

In this embodiment, the circuit and layout of a semiconductor device will be described.

FIG. 1 is an example of a circuit diagram of a photosensor. The photosensor includes a photodiode 100, a transistor 101, a transistor 102, a transistor 103, and a transistor 104.

The photodiode 100 has a function of converting light into an electric signal (an electric charge). Other than the photodiode, a light-receiving element having this function, such as a phototransistor, can also be used.

The transistor 101 has a function of transferring the converted electric signal to a gate of the transistor 103. Thus, the transistor 101 is also referred to as a transferring transistor.

The transistor 102 has a function of controlling a gate potential of the transistor 103 so that the gate potential is reset to a predetermined potential. Thus, the transistor 102 is also referred to as a reset transistor.

The transistor 103 has a function of amplifying the transferred electric signal and generating an output signal. Thus, the transistor 103 is also referred to as an amplifying transistor. Note that the amplification means here that a current value between a source and a drain is controlled with a gate potential.

The transistor 104 has a function of controlling the reading of the output signal. For example, among a plurality of photosensors, the output from a predetermined photosensor is selected by the transistor 104; thus, the transistor 104 is also referred to as a selection transistor.

In the circuit of FIG. 1, a gate of the transistor 101 is electrically connected to a wiring 106 (also referred to as a charge control signal line), one of a source and a drain of the transistor 101 is electrically connected to one electrode of the photodiode 100, and the other of the source and the drain of the transistor 101 is electrically connected to one of a source and a drain of the transistor 102 and the gate of the transistor 103. A gate of the transistor 102 is electrically connected to a wiring 107 (also referred to as a reset signal line), and the other of the source and the drain of the transistor 102 is electrically connected to a wiring 108 (also referred to as a power supply line). One of a source and a drain of the transistor 103 is electrically connected to the wiring 108, and the other thereof is electrically connected to one of a source and a drain of the transistor 104. A gate of the transistor 104 is electrically connected to a wiring 109 (also referred to as a selection signal line), and the other of the source and the drain of the transistor 104 is electrically connected to a wiring 110 (also referred to as an output line). Note that the other electrode of the photodiode 100 is electrically connected to a wiring 120. The potential of the wiring 120 can be set to a desired potential: either a fixed potential (e.g., the ground potential) or a variable potential.

Figure 2:
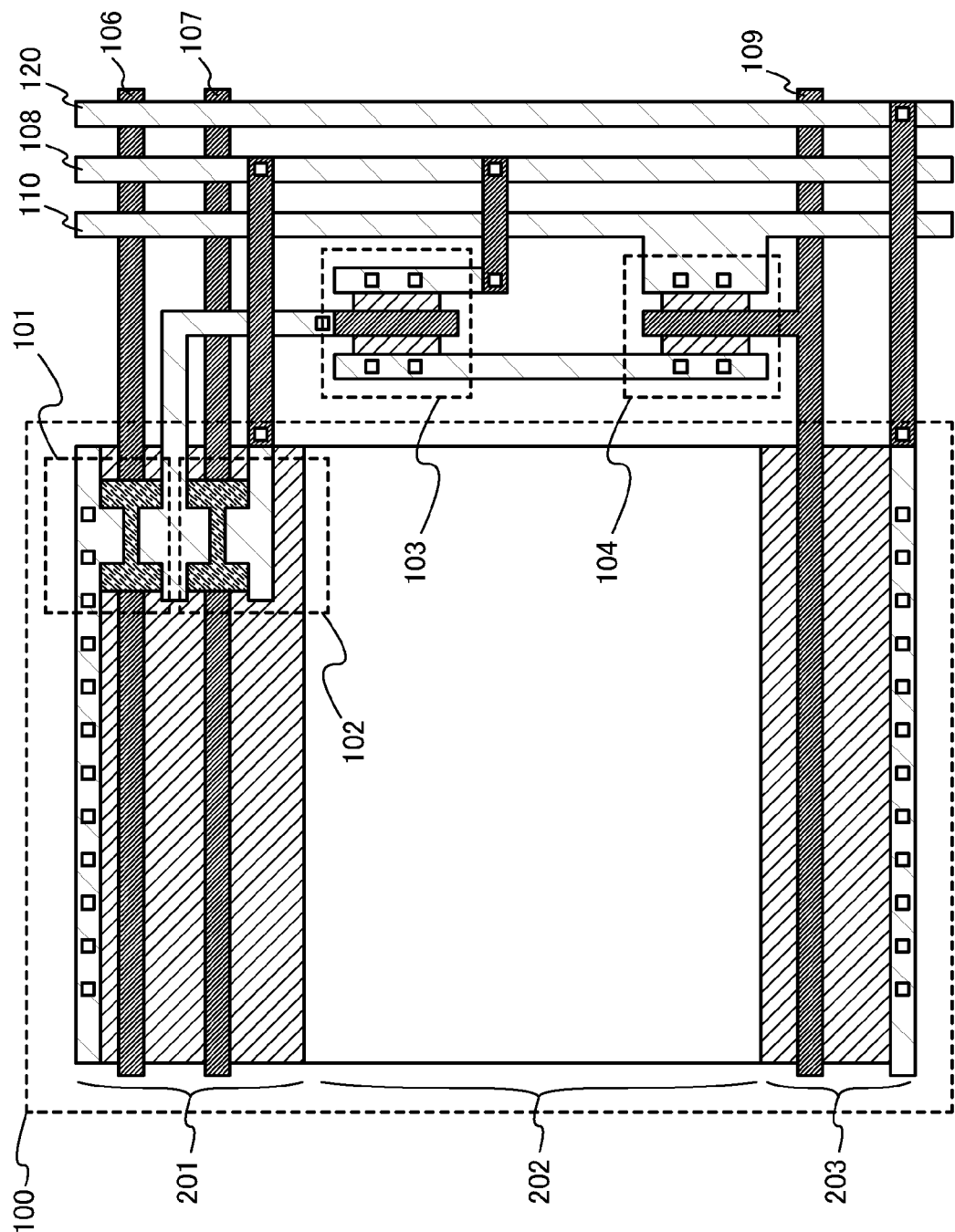
FIG. 2 illustrates an example of a layout of a semiconductor device.

FIG. 2 is an example of the layout of the photosensor.

The photosensor includes a light-receiving element (the photodiode 100) and the four transistors 101 to 104. The photodiode 100 is a lateral-junction PIN photodiode, in which an n-region 201, an i-region 202, and a p-region 203 are formed over the same surface. The transistor 101 and the transistor 102 are formed over the n-region 201. The light-receiving area can be increased with the layout in which part or the whole of the transistor 101 overlaps with the n-region 201 that is not a light-receiving region.

Note that the transistor 101 may be formed over the p-region 203 that is not a light-receiving region. The photodiode 100 can be a PN photodiode without an i-region.

In this embodiment, an oxide semiconductor is preferably used for the transistor 101 and the transistor 102. Such a structure allows reducing the leakage of the electric signal, which has been supplied to the gate of the transistor 103, from the transistor 101 and the transistor 102. This is because a transistor using an oxide semiconductor has a low leakage current in the off state. Consequently, light can be detected with high accuracy. The structure is particularly effective in the case where it takes a long time between light reception and reading out.

The structure is also effective in a semiconductor device including a plurality of photosensors (e.g., FIG. 25 or FIG. 26), in the case where the time between light reception and reading out varies from photosensor to photosensor. There are structures where light is simultaneously received in all the photosensors and reading is sequentially performed for each line.

Note that the photodiode 100, the transistor 103, and the transistor 104 are formed by making use of the same semiconductor material. Since the photodiode 100, the transistor 103, and the transistor 104 can be formed over the same surface in the same process, cost reduction can be achieved. When a semiconductor with high mobility is used, the quantum efficiency of the photodiode 100 can be increased, and amplification by the transistor 103 and reading by the transistor 104 can be performed efficiently. Here, a crystalline semiconductor is used. In particular, single crystal silicon is preferably used, though other semiconductors, such as an amorphous semiconductor or an oxide semiconductor, can be used as needed.

FIG. 3 to FIG. 6 are other examples of the layout of the photosensor, each of which is different from FIG. 2 in the light-receiving area of the photodiode 100.

Figure 3:
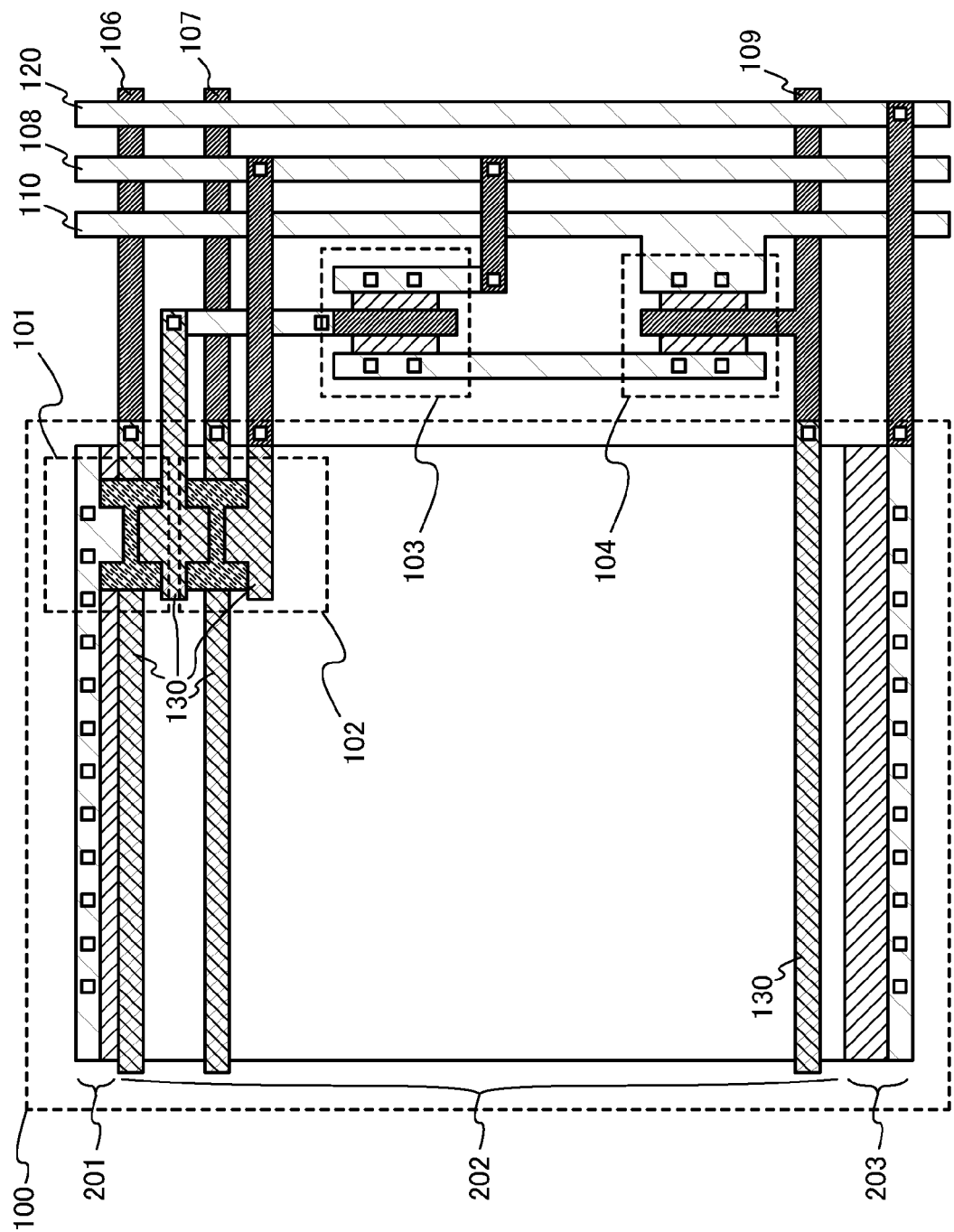
FIG. 3 illustrates an example of a layout of a semiconductor device.
Figure 4:
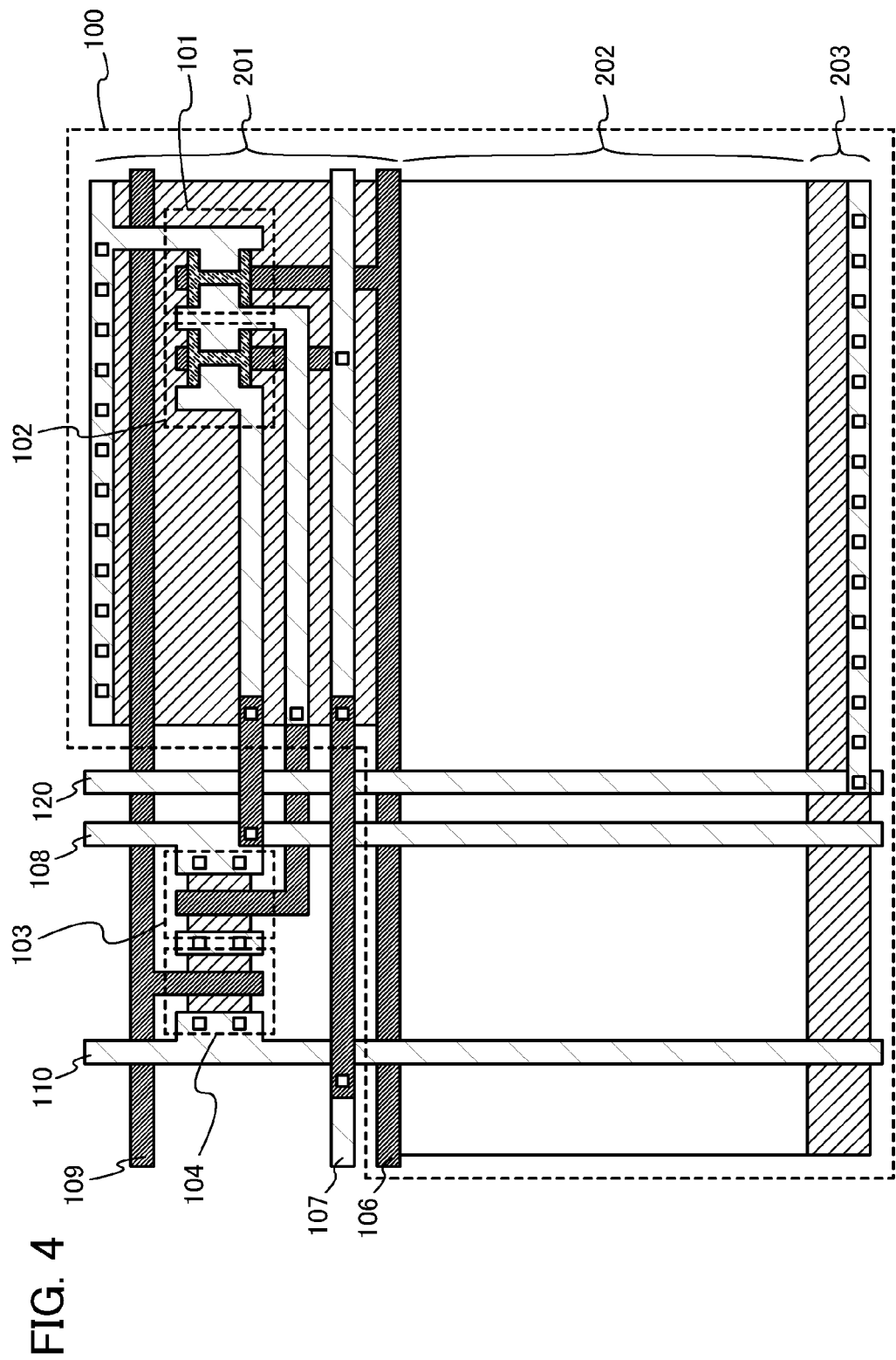
FIG. 4 illustrates an example of a layout of a semiconductor device.
Figure 5:
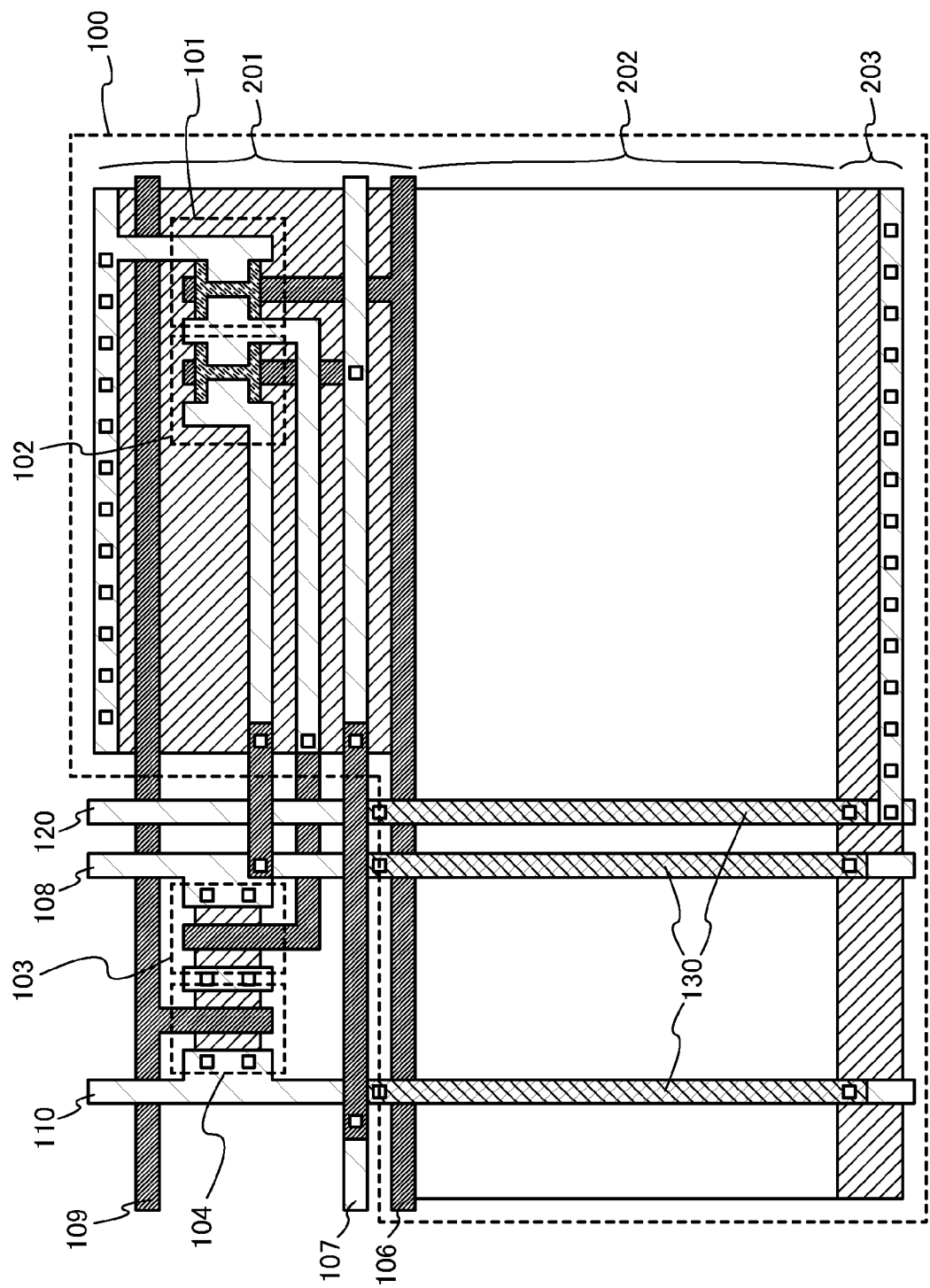
FIG. 5 illustrates an example of a layout of a semiconductor device.
Figure 6:
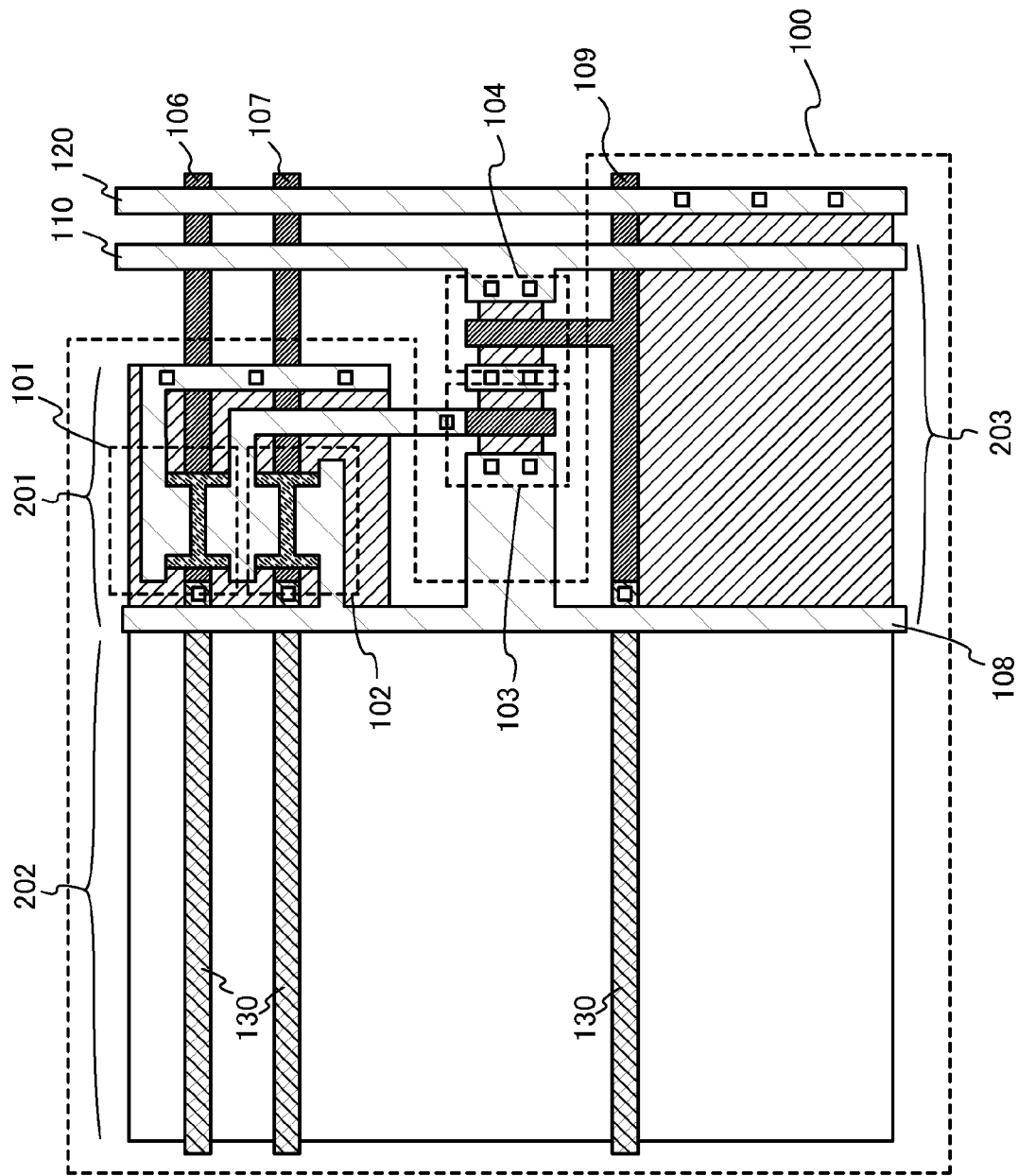
FIG. 6 illustrates an example of a layout of a semiconductor device.

Note that in FIG. 3, FIG. 5 and FIG. 6, a light-transmitting material is used for a wiring (a conductive layer 130) that overlaps with a light-receiving region of the photodiode 100 (here, the i-region 202). Light passes through the conductive layer 130 and enters the i-region 202; accordingly, the light-receiving area can be increased.

As the light-transmitting material, it is possible to use, for example, indium tin oxide (ITO), indium tin oxide containing silicon oxide (ITSO), organoindium, organotin, zinc oxide, indium zinc oxide (IZO), zinc oxide containing gallium, tin oxide, indium oxide containing tungsten oxide, indium zinc oxide containing tungsten oxide, indium oxide containing titanium oxide, or indium tin oxide containing titanium oxide.

Furthermore, in FIG. 3, the transistor 101 and the transistor 102 are formed to overlap with the i-region 202 of the photodiode. This structure makes use of the transmitting property of the oxide semiconductor: light passes through the transistor 101, the transistor 102, and the conductive layer 130 and enters the i-region 202. Accordingly, the light-receiving area can be increased.

When the light-receiving area is increased in the aforementioned manner, light sensitivity can be increased and thus light can be detected with high accuracy.

This embodiment can be implemented in appropriate combination with the other embodiments.

(Embodiment 2)

This embodiment shows an example of the circuit and layout of the semiconductor device, which is different from the example shown in Embodiment 1.

Figure 7:
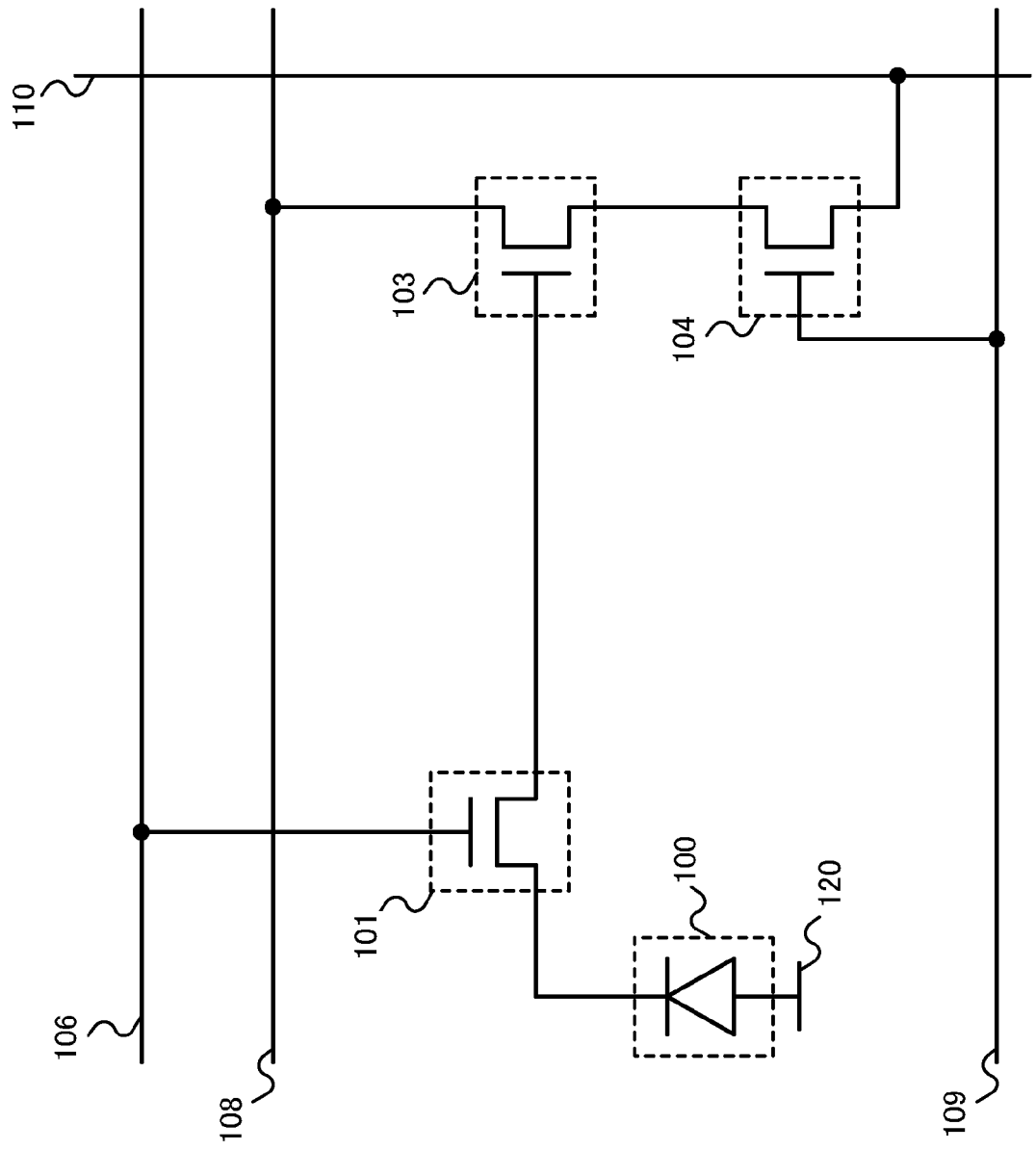
FIG. 7 illustrates an example of a circuit of a semiconductor device.
Figure 8:
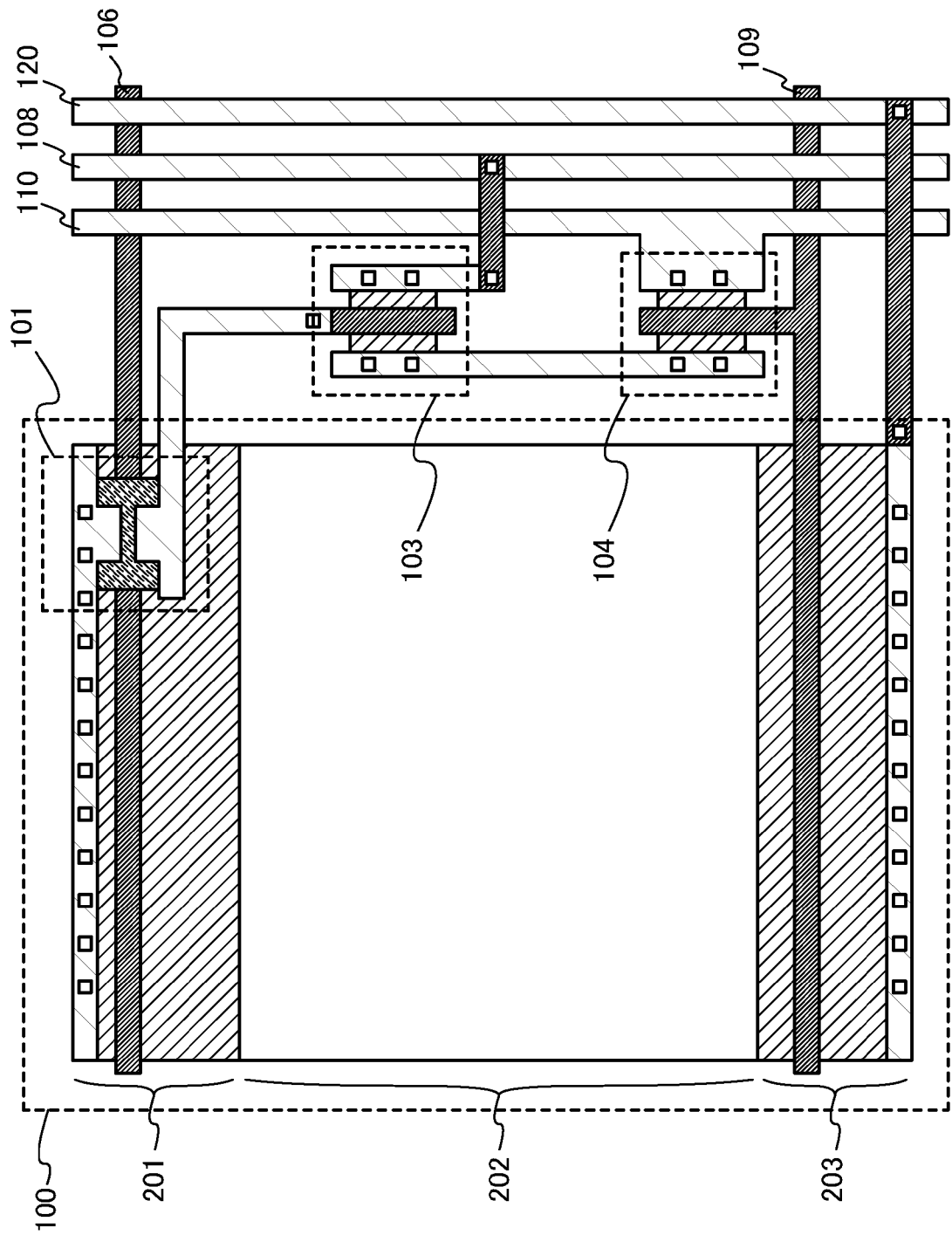
FIG. 8 illustrates an example of a layout of a semiconductor device.
Figure 9:
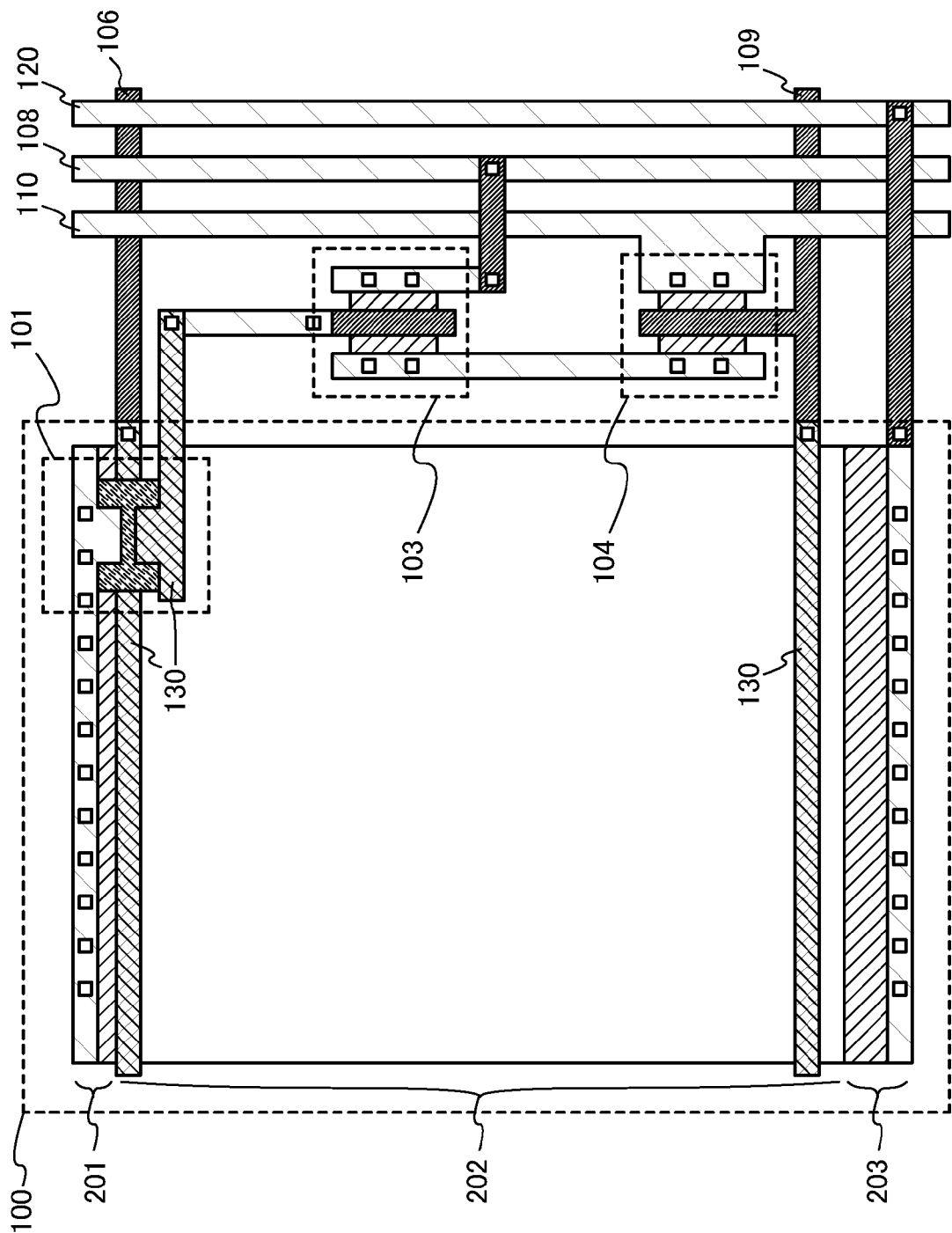
FIG. 9 illustrates an example of a layout of a semiconductor device.
Figure 10:
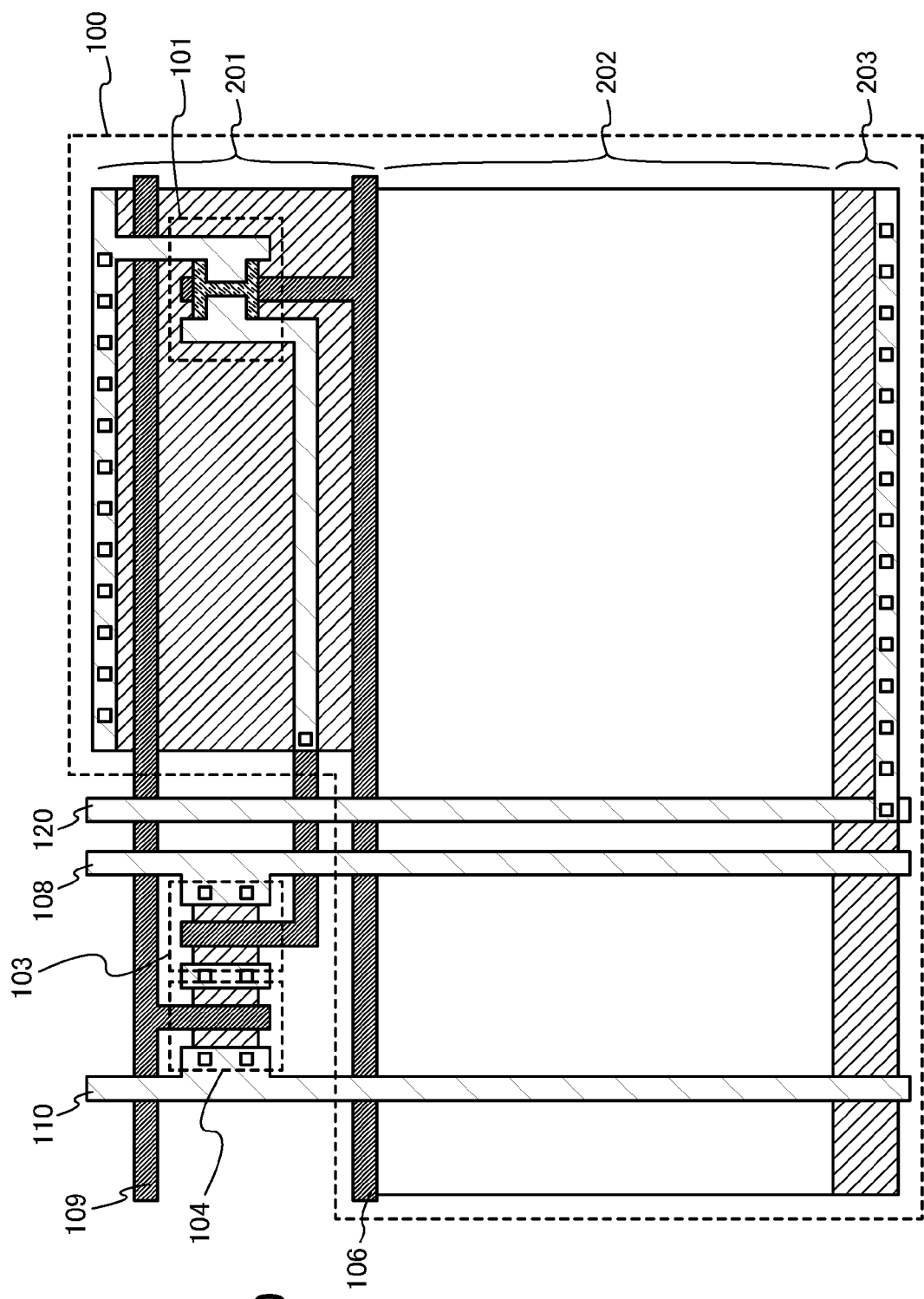
FIG. 10 illustrates an example of a layout of a semiconductor device.
Figure 11:
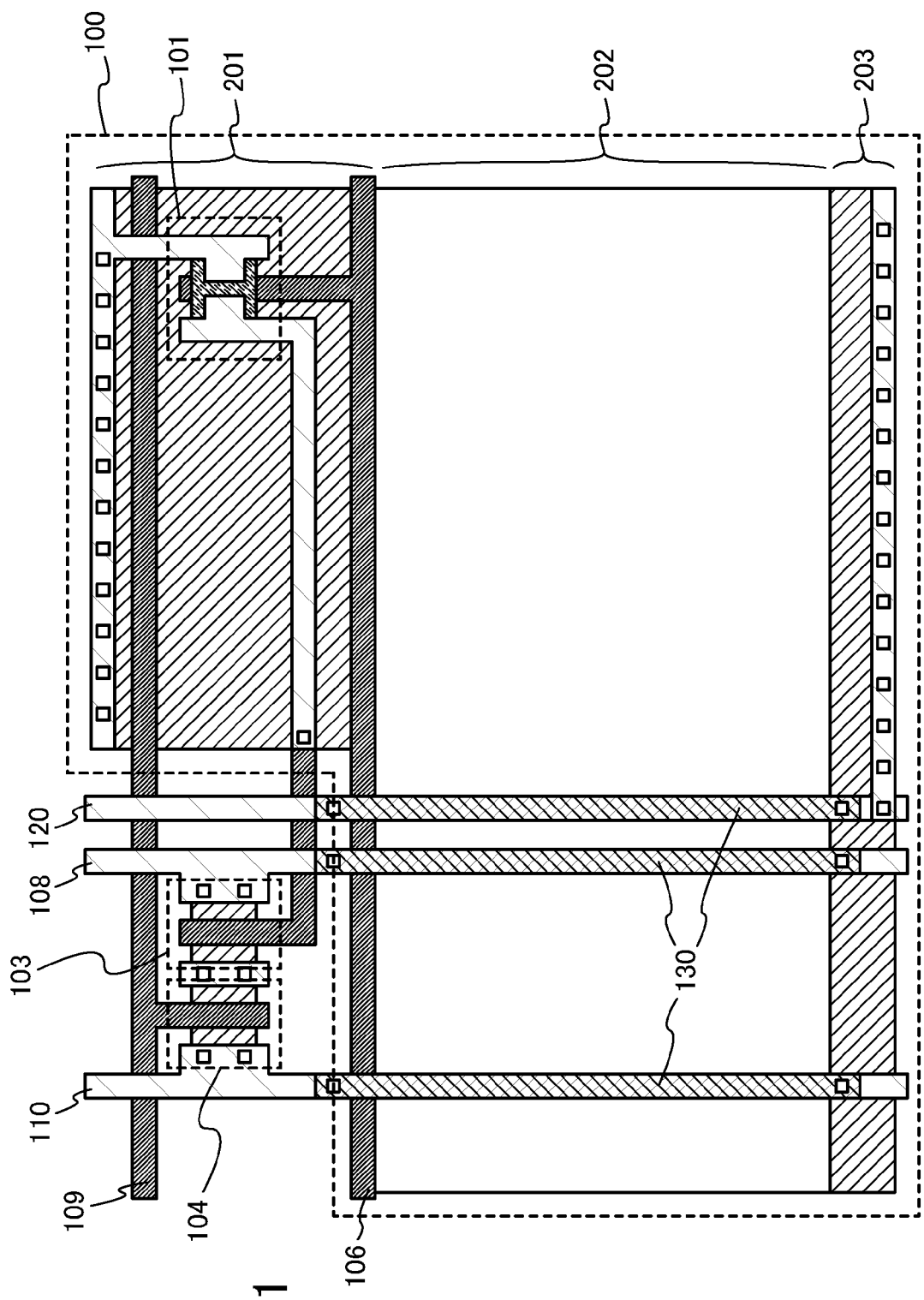
FIG. 11 illustrates an example of a layout of a semiconductor device.
Figure 12:
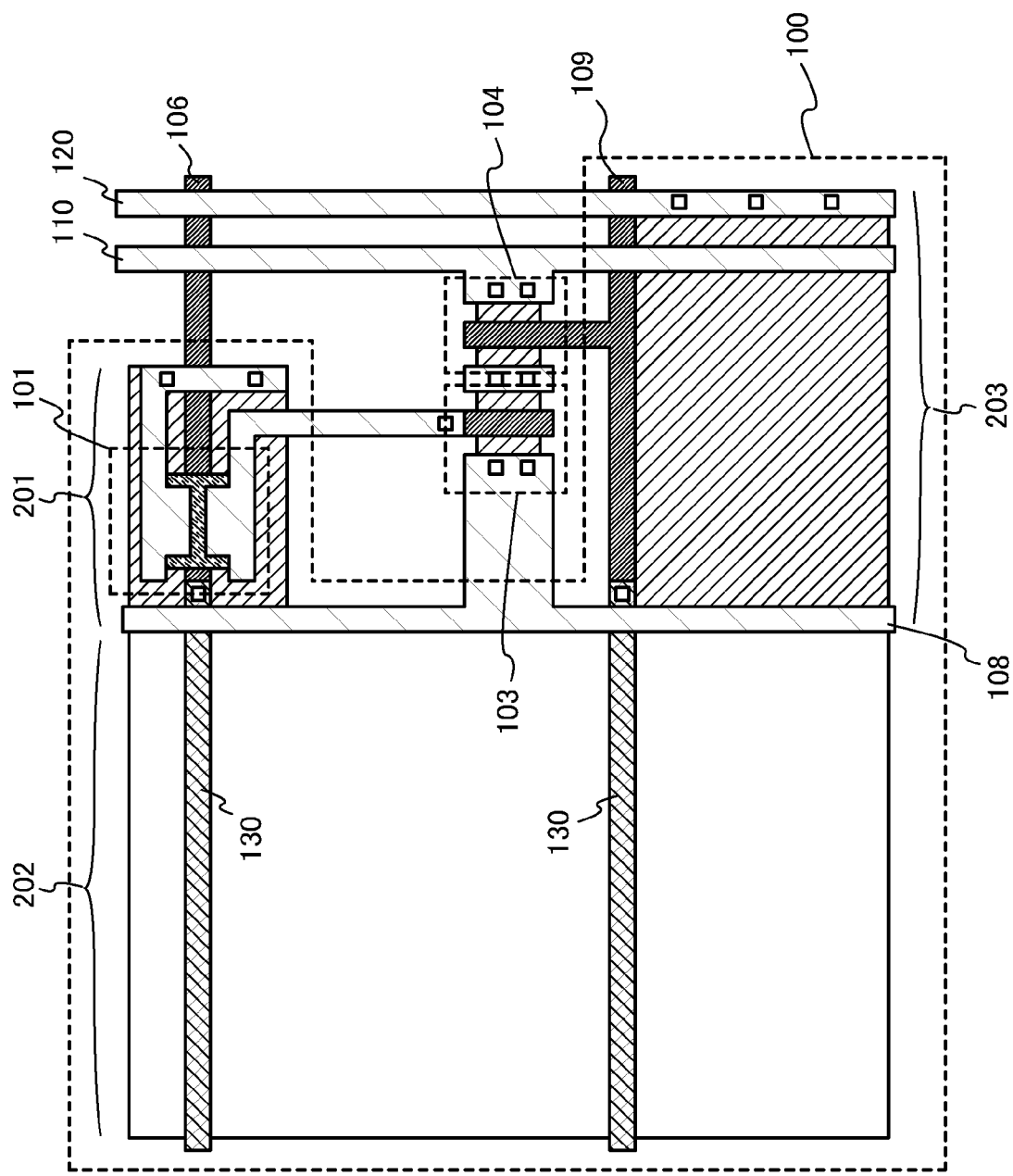
FIG. 12 illustrates an example of a layout of a semiconductor device.

FIG. 7 is an example of the circuit diagram of the photosensor, in which the transistor 102 of FIG. 1 is omitted.

FIG. 8 to FIG. 12 are examples of the layout of the circuit in FIG. 7, in which the transistor 102 of FIG. 2 to FIG. 6 is omitted, respectively. The light-receiving area can be increased because of a reduction in the number of elements.

Figure 13:
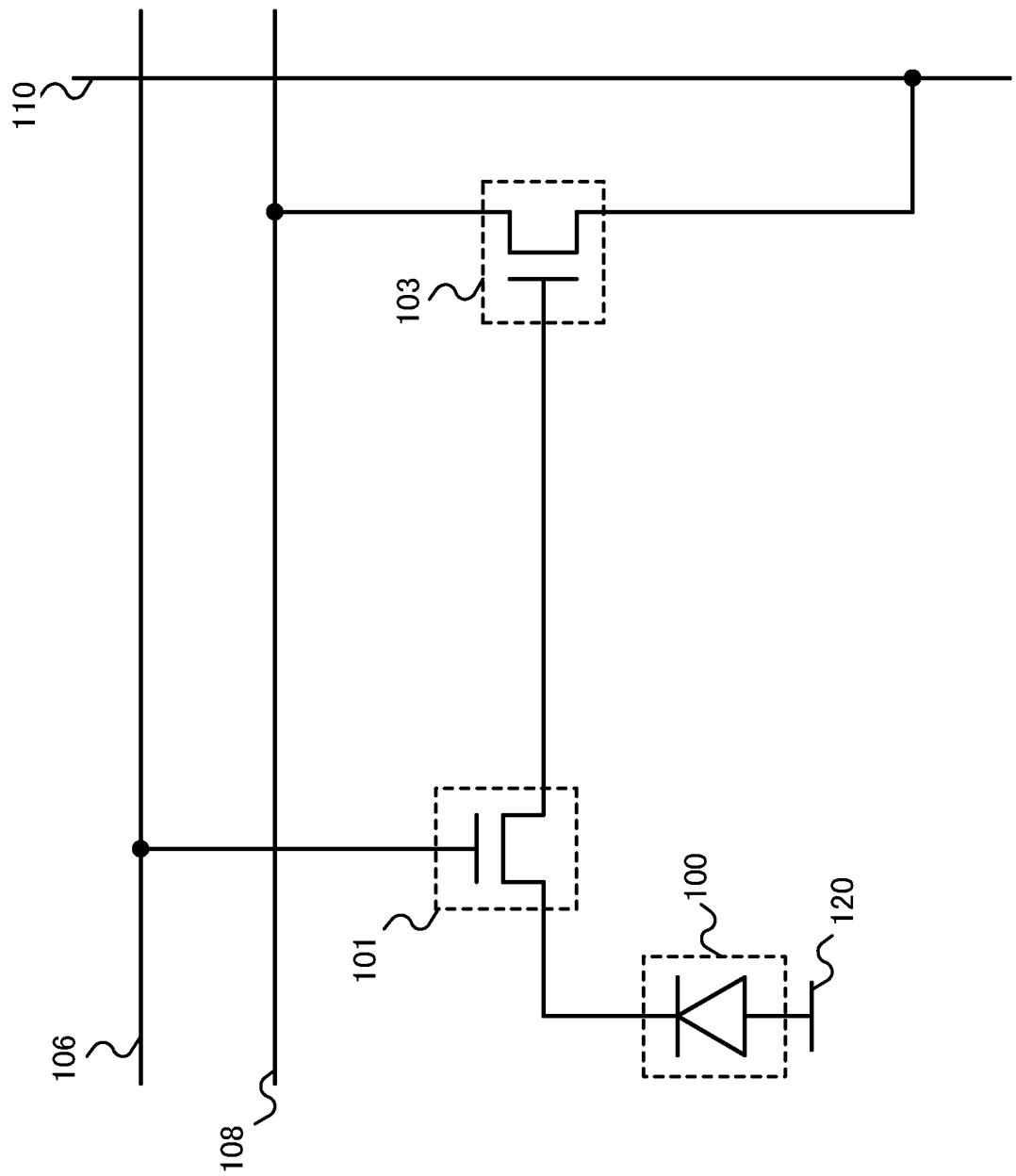
FIG. 13 illustrates an example of a circuit of a semiconductor device.
Figure 14:
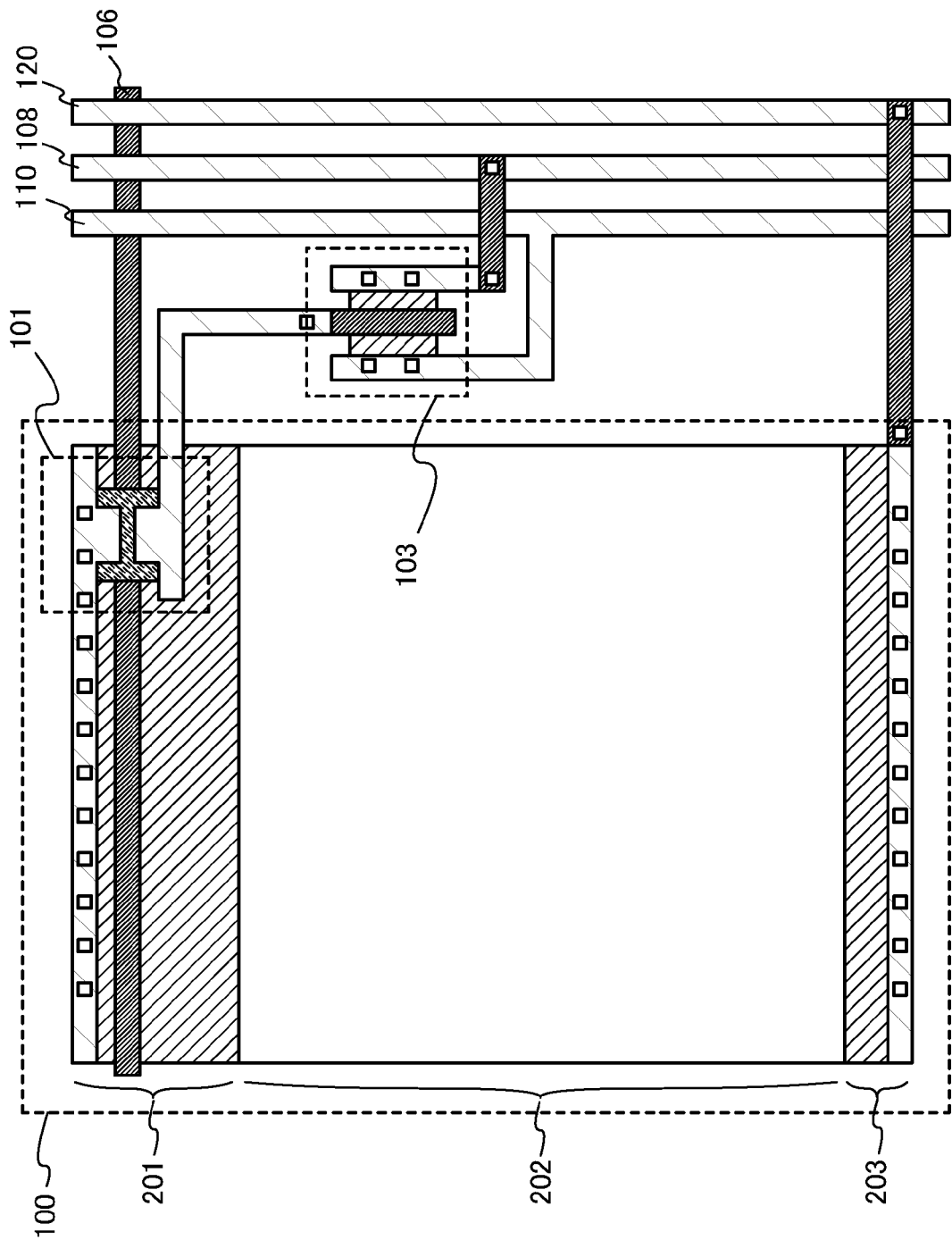
FIG. 14 illustrates an example of a layout of a semiconductor device.
Figure 15:
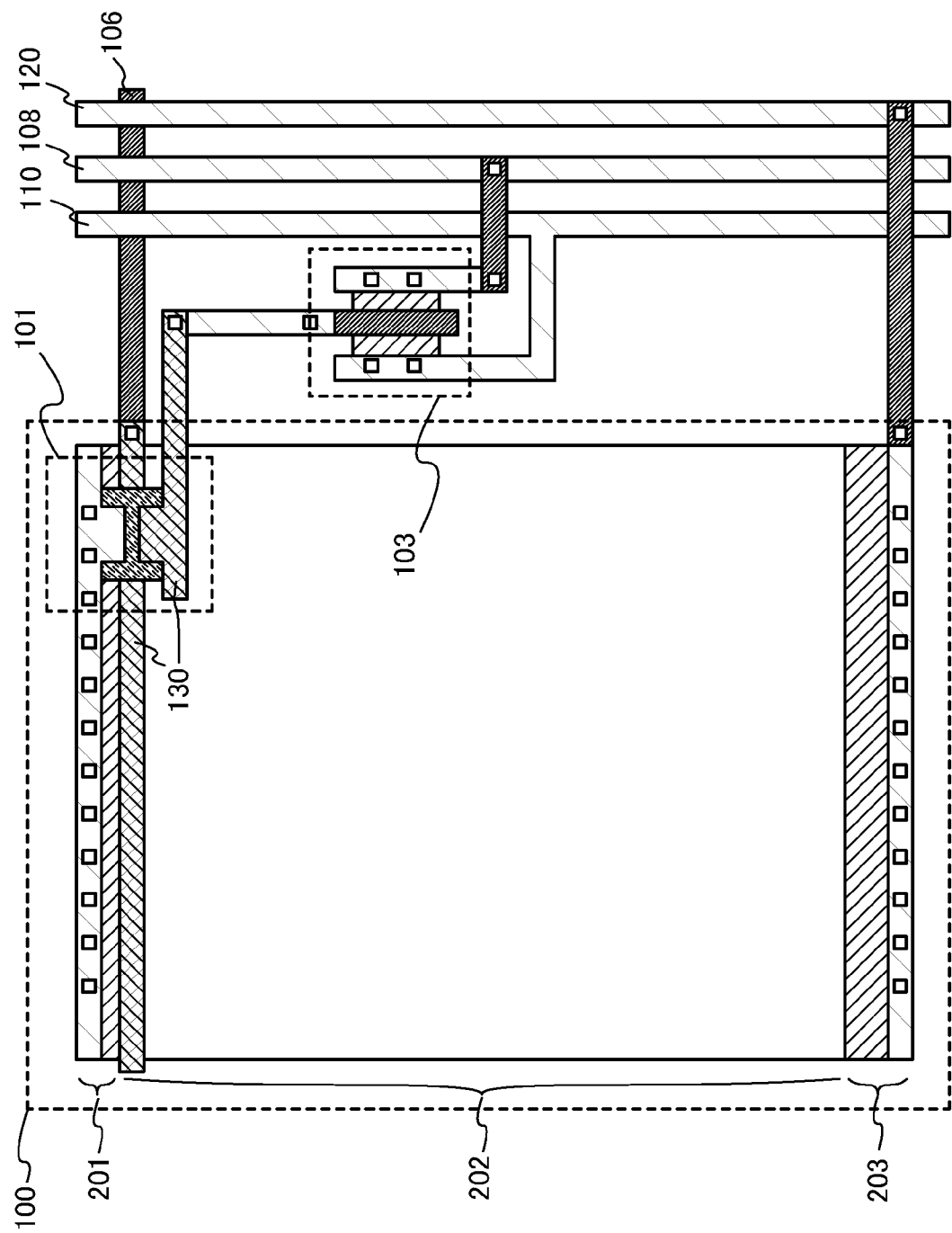
FIG. 15 illustrates an example of a layout of a semiconductor device.
Figure 16:
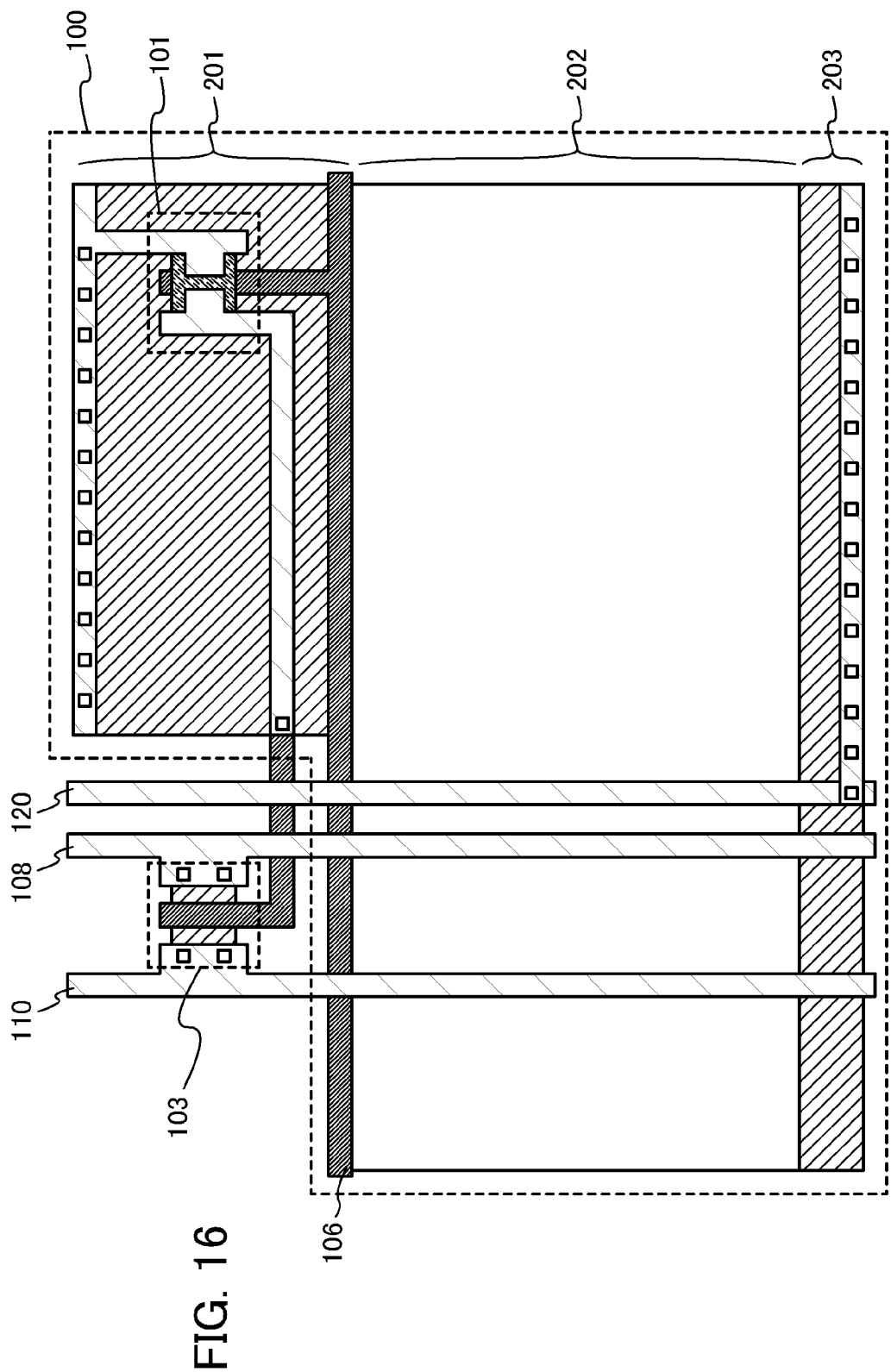
FIG. 16 illustrates an example of a layout of a semiconductor device.
Figure 17:
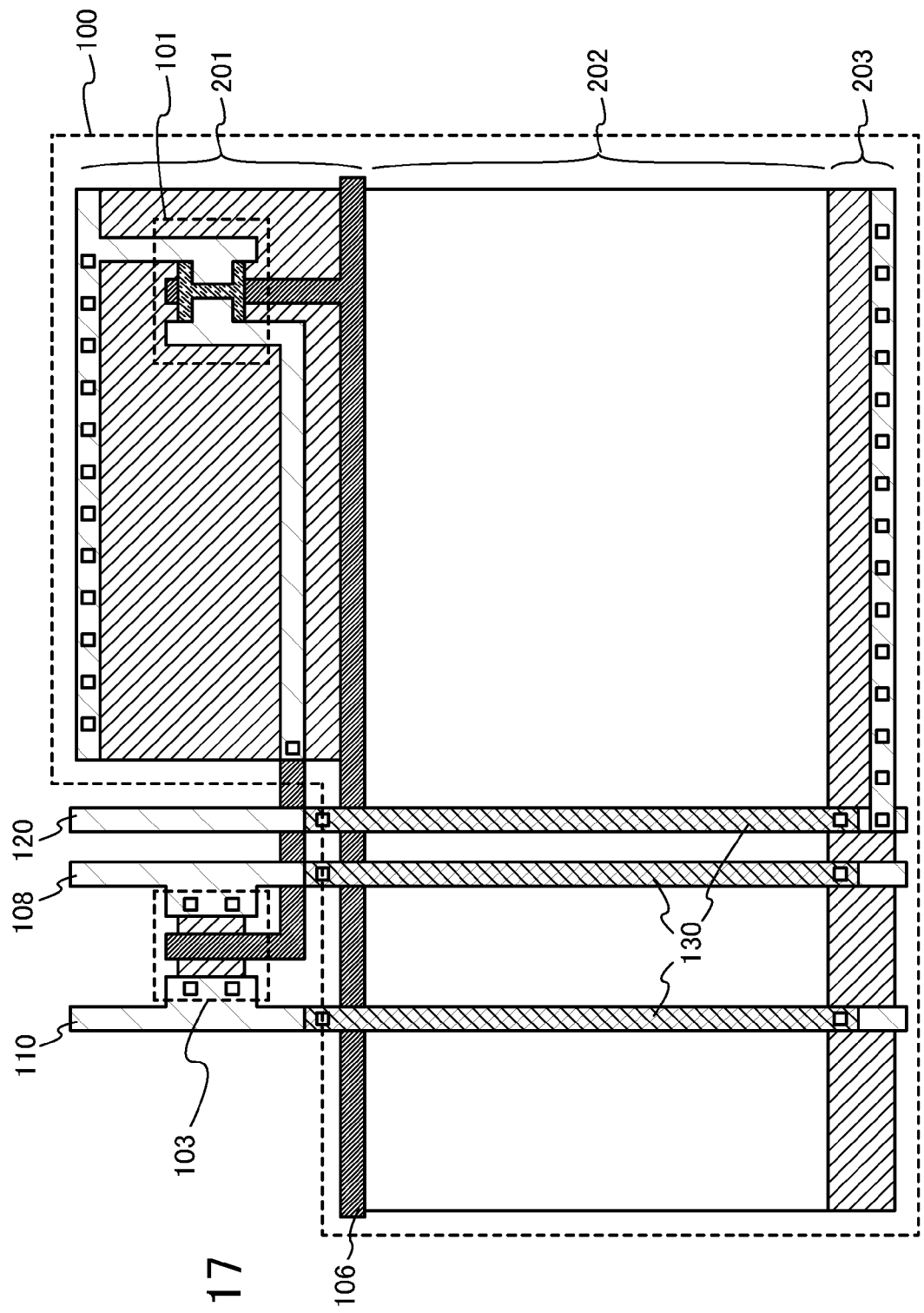
FIG. 17 illustrates an example of a layout of a semiconductor device.
Figure 18:
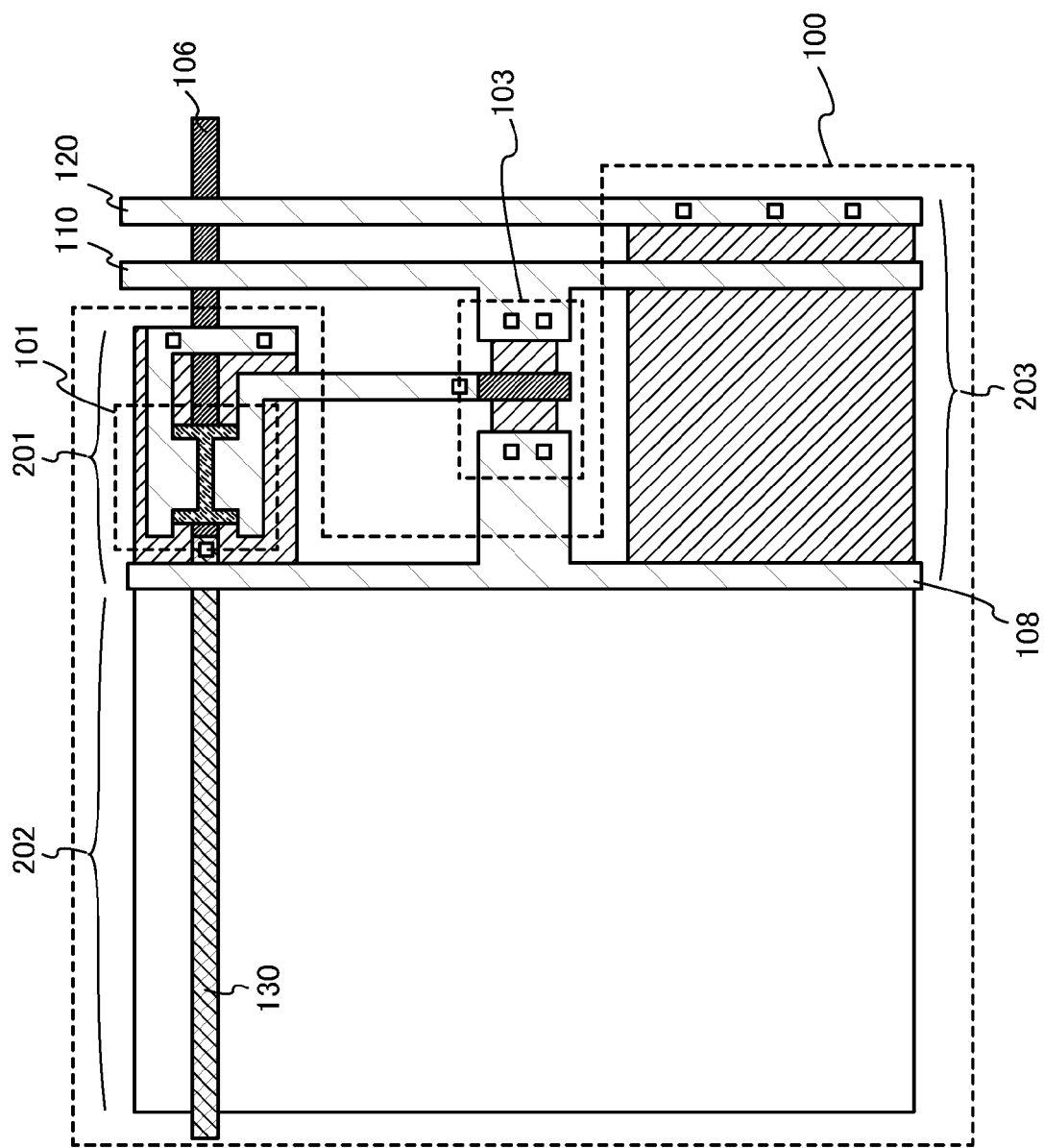
FIG. 18 illustrates an example of a layout of a semiconductor device.

FIG. 13 is an example of the circuit of the photosensor, in which the transistor 102 and the transistor 104 of FIG. 1 are omitted.

FIG. 14 to FIG. 18 are examples of the layout of the circuit in FIG. 13, in which the transistor 102 and the transistor 104 of FIG. 2 to FIG. 6 are omitted, respectively. The light-receiving area can be further increased because of a reduction in the number of elements.

This embodiment can be implemented in appropriate combination with the other embodiments.

(Embodiment 3)

In this embodiment, a cross-sectional structure of the semiconductor device will be described.

Figure 19:
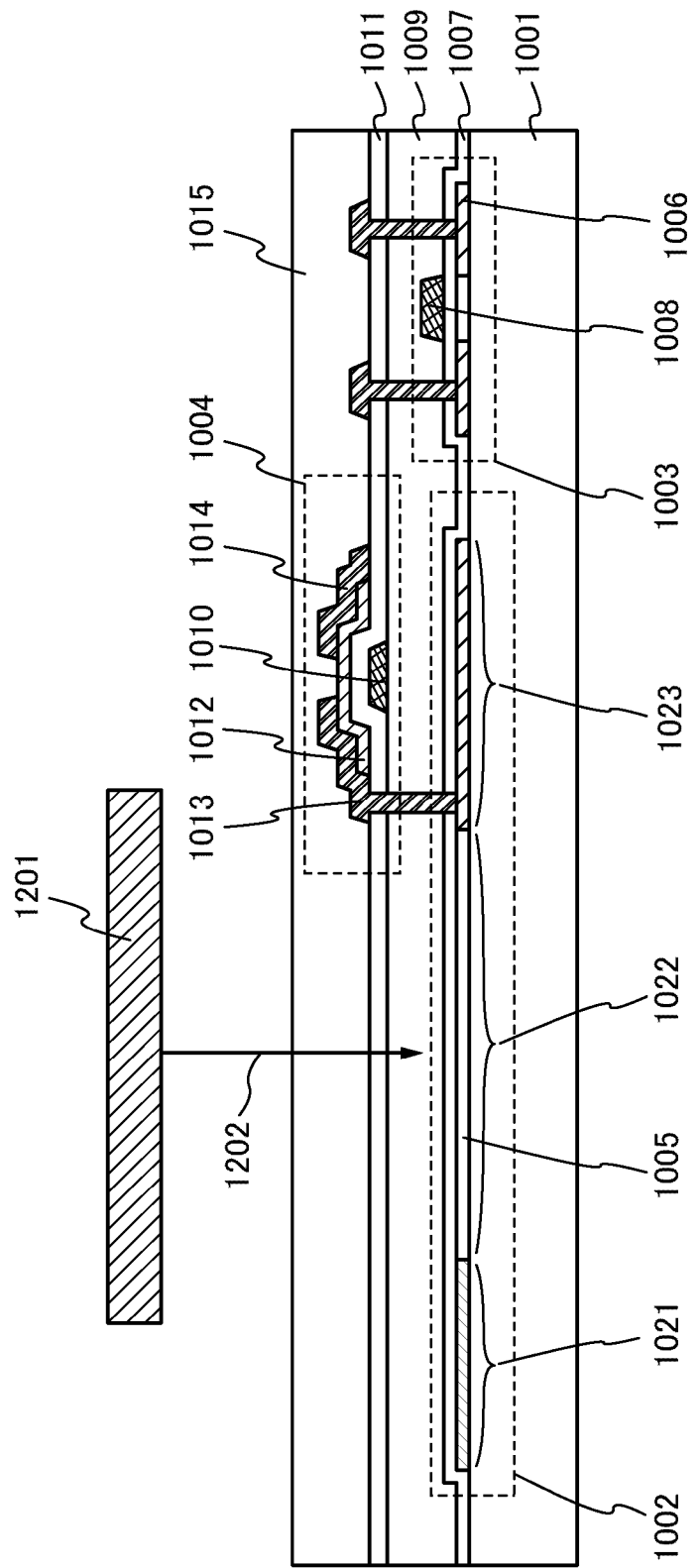
FIG. 19 illustrates an example of a cross-sectional structure of a semiconductor device.

FIG. 19 is a cross-sectional view of the photosensor illustrated in FIG. 1 to FIG. 18.

In FIG. 19, a photodiode 1002, a transistor 1003, and a transistor 1004 are provided over a substrate 1001 having an insulating surface. The photodiode 1002, the transistor 1003, and the transistor 1004 respectively illustrate an example of the cross-sectional structure of the photodiode 100, the transistor 103, and the transistor 101 illustrated in FIG. 1 to FIG. 18.

Light 1202 emitted from an object to be detected 1201, light 1202 reflected by the object to be detected 1201 (such as external light), or light 1202 emitted from the inside of the device and reflected by the object to be detected 1201 enters the photodiode 1002. An object to be detected may be provided on the substrate 1001 side so that an image thereof is taken.

The substrate 1001 can be an insulating substrate (e.g., a glass substrate or a plastic substrate), the insulating substrate on which an insulating film (e.g., a silicon oxide film or a silicon nitride film) is formed, a semiconductor substrate (e.g., a silicon substrate) on which the insulating film is formed, or a metal substrate (e.g., an aluminum substrate) on which the insulating film is formed.

The photodiode 1002 is a lateral-junction PIN photodiode and includes a semiconductor film 1005. The semiconductor film 1005 includes a region having p-type conductivity (a p-region 1021), a region having i-type conductivity (i-region 1022), and a region having n-type conductivity (n-region 1023). Note that the photodiode 1002 may be a PN photodiode.

The lateral-junction PIN or PN photodiode can be formed by adding a p-type impurity and an n-type impurity to predetermined regions of the semiconductor film 1005.

In the photodiode 1002, a single crystal semiconductor (e.g., single crystal silicon) with few crystal defects is preferably used for the semiconductor film 1005 so as to improve the proportion of an electric signal generated from incident light (the quantum efficiency).

The transistor 1003 is a top-gate thin film transistor and includes a semiconductor film 1006, a gate insulating film 1007, and a gate electrode 1008.

The transistor 1003 has a function of converting an electric signal supplied from the photodiode 1002 into an output signal. Therefore, a single crystal semiconductor (e.g., single crystal silicon) is preferably used for the semiconductor film 1006 to obtain a transistor with high mobility.

An example of forming the semiconductor film 1005 and the semiconductor film 1006 with the use of a single crystal semiconductor will be described. A damaged region is formed at a desired depth of a single crystal semiconductor substrate (e.g., a single crystal silicon substrate) by ion irradiation or the like. The single crystal semiconductor substrate and the substrate 1001 are bonded to each other with an insulating film interposed therebetween; then, the single crystal semiconductor substrate is split along the damaged region, whereby a semiconductor film is formed over the substrate 1001. The semiconductor film is processed (patterned) into a desired shape by etching or the like, so that the semiconductor film 1005 and the semiconductor film 1006 are formed. Since the semiconductor film 1005 and the semiconductor film 1006 can be formed in the same process, cost reduction can be realized. In this manner, the photodiode 1002 and the transistor 1003 can be formed on the same surface.

Note that an amorphous semiconductor, a microcrystal semiconductor, a polycrystalline semiconductor, an oxide semiconductor, or the like can also be used for the semiconductor film 1005 and the semiconductor film 1006. In particular, a single crystal semiconductor is preferably used to obtain a transistor with high mobility. As the semiconductor material, it is preferable to use a silicon semiconductor such as silicon or silicon germanium, the crystallinity of which can be easily increased.

Here, the semiconductor film 1005 is preferably made thick in order to improve the quantum efficiency of the photodiode 1002. Further, the semiconductor film 1006 is preferably made thin in order to improve the electrical properties such as the S value of the transistor 1003. In that case, the semiconductor film 1005 is only required to be made thicker than the semiconductor film 1006.

A crystal semiconductor is also preferably used for the transistor 1004 in FIG. 2 to FIG. 12 so as to obtain a transistor with high mobility. By using the same semiconductor material as the transistor 1003, the transistor 1004 can be formed in the same process as the transistor 1003, resulting in cost reduction.

Note that the gate insulating film 1007 is formed as a single layer or stacked layers using a silicon oxide film, a silicon nitride film, or the like. The gate insulating film 1007 can be formed by plasma CVD or sputtering.

Note that the gate electrode 1008 is formed as a single layer or stacked layers using a metal material such as molybdenum, titanium, chromium, tantalum, tungsten, aluminum, copper, neodymium, or scandium, or an alloy material including any of these materials as a main component. The gate electrode 1008 can be formed by sputtering or vacuum evaporation.

The transistor 1003 can be a bottom-gate transistor, and can have a channel-stop structure or a channel-etched structure.

The transistor 1004 is a bottom-gate inverted-staggered thin film transistor and includes a gate electrode 1010, a gate insulating film 1011, a semiconductor film 1012, an electrode 1013, and an electrode 1014. An insulating film 1015 is provided over the transistor 1004.

A feature of the structure is that the transistor 1004 is formed over the photodiode 1002 and the transistor 1003 with an insulating film 1009 interposed therebetween. When the transistor 1004 and the photodiode 1002 are formed on different layers in this manner, the area of the photodiode 1002 can be increased.

Furthermore, part or the whole of the transistor 1004 is preferably formed to overlap with either the n-region 1023 or the p-region 1021 of the photodiode 1002, whereby the light-receiving area of the photodiode 1002 can be increased. Also in the case of a PN photodiode, part or the whole of the transistor 1004 is preferably formed to overlap with either the n-region or the p-region.

The function of the transistor 1004 is to accumulate an electric signal supplied from the photodiode 1002 in the gate of the transistor 1003 and to retain the electric signal. Therefore, an oxide semiconductor is preferably used for the semiconductor film 1012 so that the transistor 1004 has an extremely low off-current.

It is also preferable to use an oxide semiconductor for the transistor 102 in FIG. 1 to FIG. 6 so that the transistor 102 has a low off-current. By using the same semiconductor material as the transistor 1004, the transistor 102 can be formed over the same surface and in the same process as the transistor 1004, resulting in cost reduction. When the transistor 1004 is formed to overlap with the n-region 1023 or the p-region 1021, an increase in light-receiving area can be achieved.

An example of forming the semiconductor film 1012 using an oxide semiconductor will be described below.

One of the factors that increase the off-current of a transistor is an impurity such as hydrogen (e.g., hydrogen, water, or a hydroxyl group) contained in an oxide semiconductor. Hydrogen or the like might be a carrier supplier (donor) in an oxide semiconductor, which causes electric current even in the off state. That is, an oxide semiconductor containing a large amount of hydrogen or the like becomes an n-type oxide semiconductor.

Thus, in the manufacturing method shown below, the amount of hydrogen in an oxide semiconductor is reduced as much as possible and the concentration of oxygen which is a constituent element is increased, whereby the oxide semiconductor is highly purified. The highly-purified oxide semiconductor is an intrinsic or substantially intrinsic semiconductor, resulting in a reduction in off-current.

First, an oxide semiconductor film is formed over the insulating film 1009 by sputtering.

As a target used for forming the oxide semiconductor film, a target of a metal oxide containing zinc oxide as a main component can be used. For example, it is possible to use a target with a composition ratio of $In_2O_3:Ga_2O_3:ZnO=1:1:1$, that is, $In:Ga:Zn=1:1:0.5$. It is also possible to use a target with a composition ratio of $In:Ga:Zn=1:1:1$ or a composition ratio of $In:Ga:Zn=1:1:2$. Further, a target which includes $SiO_2$ at 2 wt % to 10 wt % inclusive can be used.

Note that the oxide semiconductor film can be formed in a rare gas (typically, argon) atmosphere, an oxygen atmosphere, or a mixed atmosphere of a rare gas and oxygen. Here, a sputtering gas used for forming the oxide semiconductor film is a high-purity gas in which impurities such as hydrogen, water, hydroxyl groups, or hydride are reduced down to concentrations of the order of ppm or ppb levels.

The oxide semiconductor film is formed by introducing a sputtering gas from which hydrogen and moisture are removed, while removing moisture remaining in a treatment chamber. In order to remove moisture remaining in the treatment chamber, an entrapment vacuum pump is preferably used. For example, a cryopump, an ion pump, or a titanium sublimation pump is preferably used.

The thickness of the oxide semiconductor film can be 2 nm to 200 nm inclusive, preferably 5 nm to 30 nm inclusive. Then, the oxide semiconductor film is processed (patterned) into a desired shape by etching or the like, whereby the semiconductor film 1012 is formed.

Although an In—Ga—Zn—O is used for the oxide semiconductor film in the above example, the following oxide semiconductors can also be used: In—Sn—Ga—Zn—O, In—Sn—Zn—O, In—Al—Zn—O, Sn—Ga—Zn—O, Al—Ga—Zn—O, Sn—Al—Zn—O, In—Zn—O, Sn—Zn—O, Al—Zn—O, Zn—Mg—O, Sn—Mg—O, In—Mg—O, In—O, Sn—O, Zn—O, and the like. The oxide semiconductor film may contain Si. Further, the oxide semiconductor film may be amorphous or crystalline. Further, the oxide semiconductor film may be non-single-crystal or single crystal.

As the oxide semiconductor film, a thin film represented by $InMO_3(ZnO)_m$ (m>0) can also be used. Here, M denotes one or more of metal elements selected from Ga, Al, Mn, and Co. For example, M can be Ga, Ga and Al, Ga and Mn, or Ga and Co.

Next, first heat treatment is performed on the oxide semiconductor film (the semiconductor film 1012). The temperature of the first heat treatment is higher than or equal to 400° C. and lower than or equal to 750° C., preferably higher than or equal to 400° C. and lower than the strain point of the substrate.

Through the first heat treatment, hydrogen, water, hydroxyl groups, and the like can be removed from the oxide semiconductor film (the semiconductor film 1012) (dehydrogenation treatment). The dehydrogenation treatment through the first heat treatment is significantly effective because such impurities become a donor in the oxide semiconductor film and increase the off-current of the transistor.

Note that the first heat treatment can be performed in an electric furnace. Alternatively, heat conduction or heat radiation from a heating element such as a resistance heating element can be used for the first heat treatment. In that case, an RTA (rapid thermal anneal) apparatus such as a GRTA (gas rapid thermal anneal) apparatus or an LRTA (lamp rapid thermal anneal) apparatus can be used.

An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp.

A GRTA apparatus is an apparatus for heat treatment using a high-temperature gas. As the gas, an inert gas (typically, a rare gas such as argon) or a nitrogen gas can be used. The use of the GRTA apparatus is particularly effective because high-temperature heat treatment in a short time is enabled.

The first heat treatment may be performed before the patterning of the oxide semiconductor film, after the formation of the electrode 1013 and the electrode 1014, or after the formation of the insulating film 1015. However, the first heat treatment is preferably performed before the formation of the electrode 1013 and the electrode 1014 so that the electrodes are not damaged by the first heat treatment.

During the first heat treatment, oxygen deficiencies might be generated in the oxide semiconductor. Therefore, after the first heat treatment, oxygen is preferably introduced to the oxide semiconductor (treatment for supplying oxygen) so that oxygen which is a constituent element is highly purified.

Specifically, as an example the treatment for supplying oxygen, the first heat treatment is followed by second heat treatment in an oxygen atmosphere or an atmosphere containing nitrogen or oxygen (for example, the volume ratio of nitrogen to oxygen is 4 to 1). Alternatively, plasma treatment may be performed in an oxygen atmosphere, whereby the oxygen concentration in the oxide semiconductor film can be increased and the oxide semiconductor film can be highly purified. The temperature of the second heat treatment is higher than or equal to 200° C. and lower than or equal to 400° C., preferably higher than or equal to 250° C. and lower than or equal to 350° C.

As another example of the treatment for supplying oxygen, an oxide insulating film (the insulating film 1015) such as a silicon oxide film is formed on and in contact with the semiconductor film 1012, and then a third heat treatment is performed. Oxygen in the insulating film 1015 moves to the semiconductor film 1012 to increase the oxygen concentration in the oxide semiconductor, whereby the oxide semiconductor film can be highly purified. The temperature of the third heat treatment is higher than or equal to 200° C. and lower than or equal to 400° C., preferably higher than or equal to 250° C. and lower than or equal to 350° C. Note that also in the case of a top-gate transistor, the oxide semiconductor can be highly purified in such a manner that a gate insulating film on and in contact with the semiconductor film 1012 is formed of a silicon oxide film or the like and similar heat treatment is performed.

As described above, the oxide semiconductor film can be highly purified through the treatment for supplying oxygen such as the second heat treatment or the third heat treatment after the dehydrogenation treatment by the first heat treatment. When being highly purified, the oxide semiconductor can be made intrinsic or substantially intrinsic, resulting in a reduction in the off-current of the transistor 1004.

Note that the insulating film 1009 is a single layer or stacked layers using a silicon oxide film, a silicon nitride film, or the like, and is formed over the photodiode 1002 and the transistor 1003. The insulating film 1009 can be formed by plasma CVD or sputtering. The insulating film 1009 may also be formed of a resin film such as a polyimide film by coating or the like.

The gate electrode 1010 is formed as a single layer or stacked layers using a metal material such as molybdenum, titanium, chromium, tantalum, tungsten, aluminum, copper, neodymium, or scandium, or an alloy material including any of these materials as a main component. The gate electrode 1010 can be formed by sputtering or vacuum evaporation.

The gate insulating film 1011 is formed as a single layer or stacked layers using a silicon oxide film, a silicon nitride film, or the like. The gate insulating film 1011 may be formed by plasma CVD or sputtering.

The electrode 1013 and the electrode 1014, which are formed over the gate insulating film 1011 and the semiconductor film 1012, each are a single layer or stacked layers using a metal such as molybdenum, titanium, chromium, tantalum, tungsten, aluminum, copper, or yttrium, an alloy material including any of these materials as a main component, or a metal oxide having conductivity such as indium oxide. The electrode 1013 and the electrode 1014 can be formed by sputtering or vacuum evaporation. Here, it is preferable that the electrode 1013 be electrically connected to the n-region 1023 of the photodiode 1002 through a contact hole formed in the gate insulating film 1007, the insulating film 1009, and the gate insulating film 1011. It is also preferable that the electrode 1013 and the electrode 1014 be formed to overlap with the gate electrode 1010, whereby the current drive capability of the transistor 1004 can be increased. Such a structure is particularly effective in the case of using an intrinsic or substantially intrinsic oxide semiconductor.

The highly-purified oxide semiconductor and a transistor using the same will be described in detail below.

As an example of the highly-purified oxide semiconductor, there is an oxide semiconductor whose carrier concentration is less than $1 \times 10^{14}/cm^3$, preferably less than $1 \times 10^{12}/cm^3$, and more preferably less than $1 \times 10^{11}/cm^3$ or less than $6.0 \times 10^{10}/cm^3$.

A transistor using a highly-purified oxide semiconductor is characterized in that the off-current is much lower than that of a transistor including a semiconductor containing silicon, for example.

The following shows the result of measuring the off-current characteristics of a transistor with an evaluation element (also referred to as TEG: Test Element Group). Note that the description is made here on an n-channel transistor.

Figure 28:
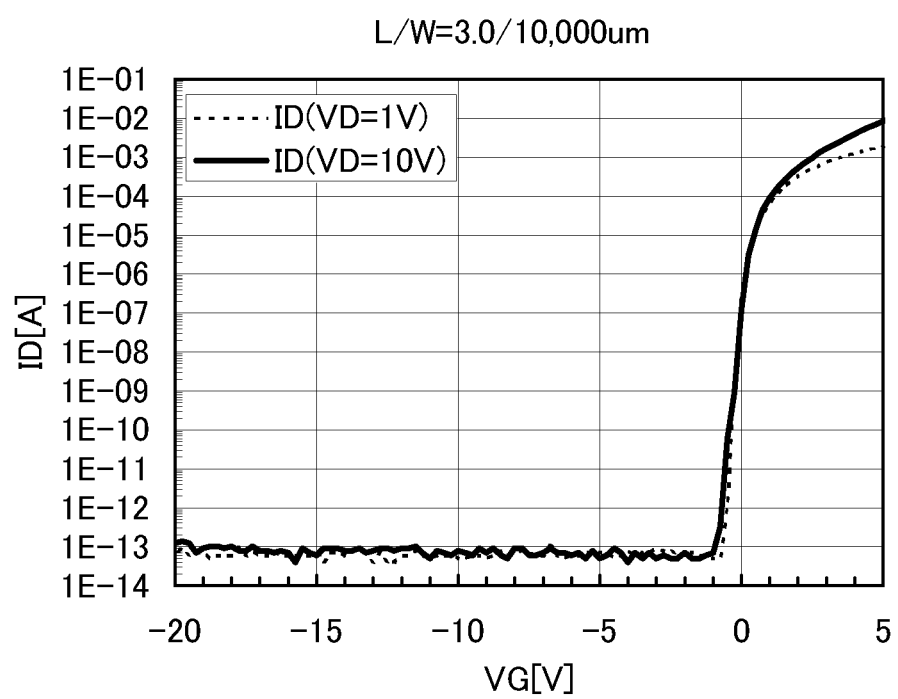
FIG. 28 is a graph showing characteristics of a semiconductor device.

In the TEG, a transistor with L/W=3 μm/10000 μm, which includes 200 transistors with L/W=3 μm/50 μm (thickness d:30 nm) connected in parallel, is provided. FIG. 28 illustrates the initial characteristics of the transistor. Here, $V_G$ is in the range of −20 V to +5 V inclusive. In order to measure the initial characteristics of the transistor, the characteristics of changes in the source-drain current (hereinafter, referred to as a drain current or $I_D$), i.e., $V_G$-$I_D$ characteristics, were measured under the conditions where the substrate temperature was set to room temperature, the voltage between the source and the drain (hereinafter, referred to as a drain voltage or $V_D$) was set to 10 V, and the voltage between the source and the gate (hereinafter, referred to as a gate voltage or $V_G$) was changed from −20 V to +20 V.

As illustrated in FIG. 28, the transistor with a channel width W of 10000 μm has an off-current of $1 \times 10^{-13}$ A or less at $V_D$ of 1 V and 10 V, which is less than or equal to the resolution (100 fA) of a measurement device (a semiconductor parameter analyzer, Agilent 4156C manufactured by Agilent Technologies Inc.). The off-current per micrometer of the channel width corresponds to 10 aA/μm.

Note that in this specification, the off-current (also referred to as leakage current) means a current flowing between a source and a drain of an n-channel transistor when a predetermined gate voltage in the range of −20 V to −5 V inclusive is applied at room temperature in the case where the n-channel transistor has a positive threshold voltage $V_{th}$. Note that the room temperature is 15° C. to 25° C. inclusive. A transistor including an oxide semiconductor that is disclosed in this specification has a current per unit channel width (W) of 100 aA/μm or less, preferably 1 aA/μm or less, and more preferably 10 zA/μm or less at room temperature.

Moreover, the transistor including a high-purity oxide semiconductor has favorable temperature characteristics. Typically, in the temperature range of −25° C. to 150° C. inclusive, the current-voltage characteristics of the transistor, such as on-current, off-current, field-effect mobility, S value, and threshold voltage, hardly change and deteriorate due to temperature. In addition, a high-purity oxide semiconductor hardly deteriorates due to light irradiation, which results in an increase in the reliability of, in particular, a semiconductor device using light such as a photosensor.

Figure 20:
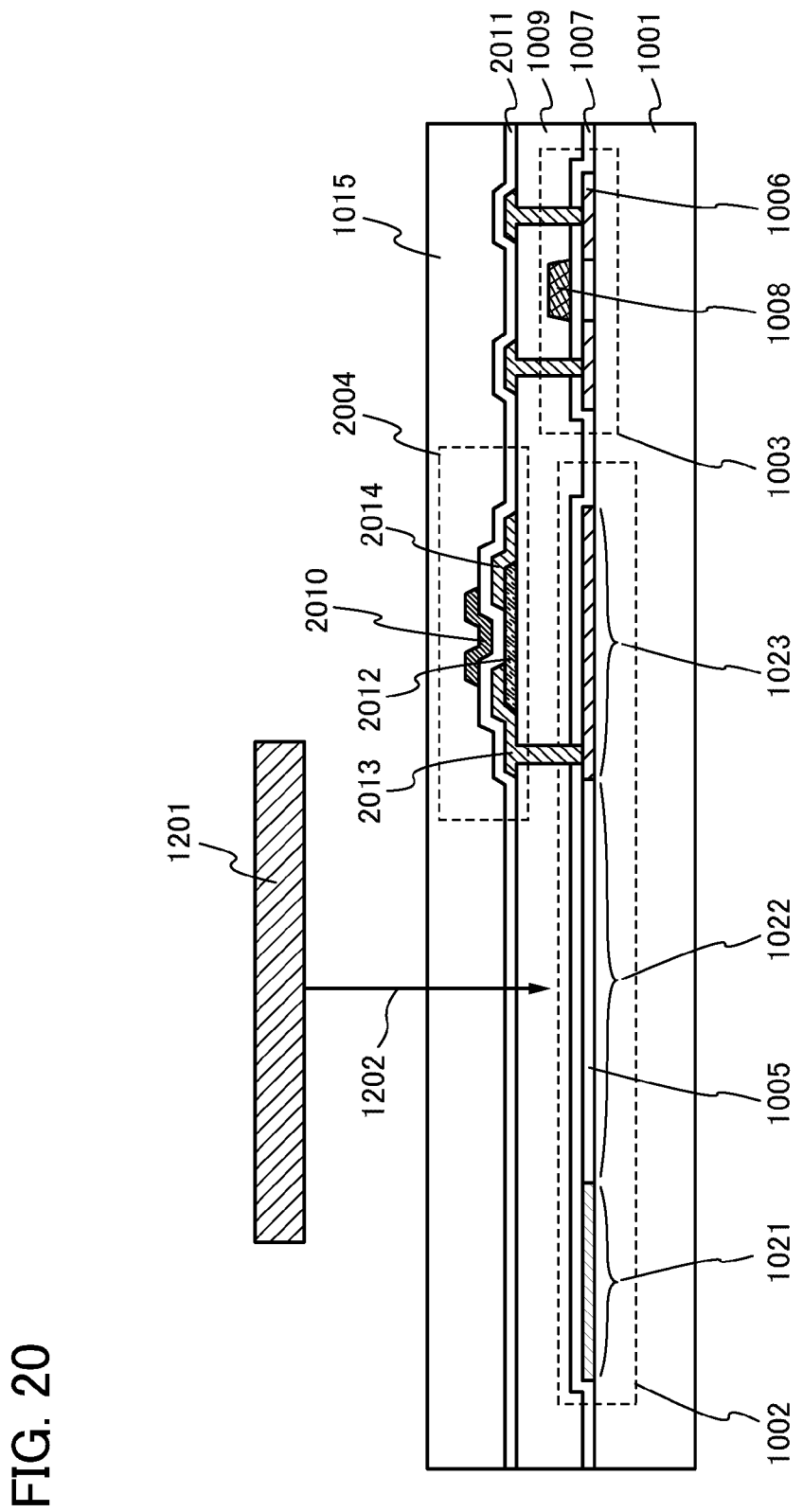
FIG. 20 illustrates an example of a cross-sectional structure of a semiconductor device.

Although the bottom-gate transistor 1004 is shown as an example in this embodiment, a top-gate transistor 2004 may be used as illustrated in FIG. 20. The transistor 2004 includes a semiconductor film 2012, an electrode 2013, an electrode 2014, a gate insulating film 2011, and a gate electrode 2010.

Note that for each of the aforementioned semiconductor elements, a thin film semiconductor or a bulk semiconductor can be used.

This embodiment can be implemented in appropriate combination with the other embodiments.

(Embodiment 4)

This embodiment shows an example of the circuit, layout, and cross-sectional structure of the semiconductor device, which is different from the example shown in Embodiments 1 to 3.

Figure 21:
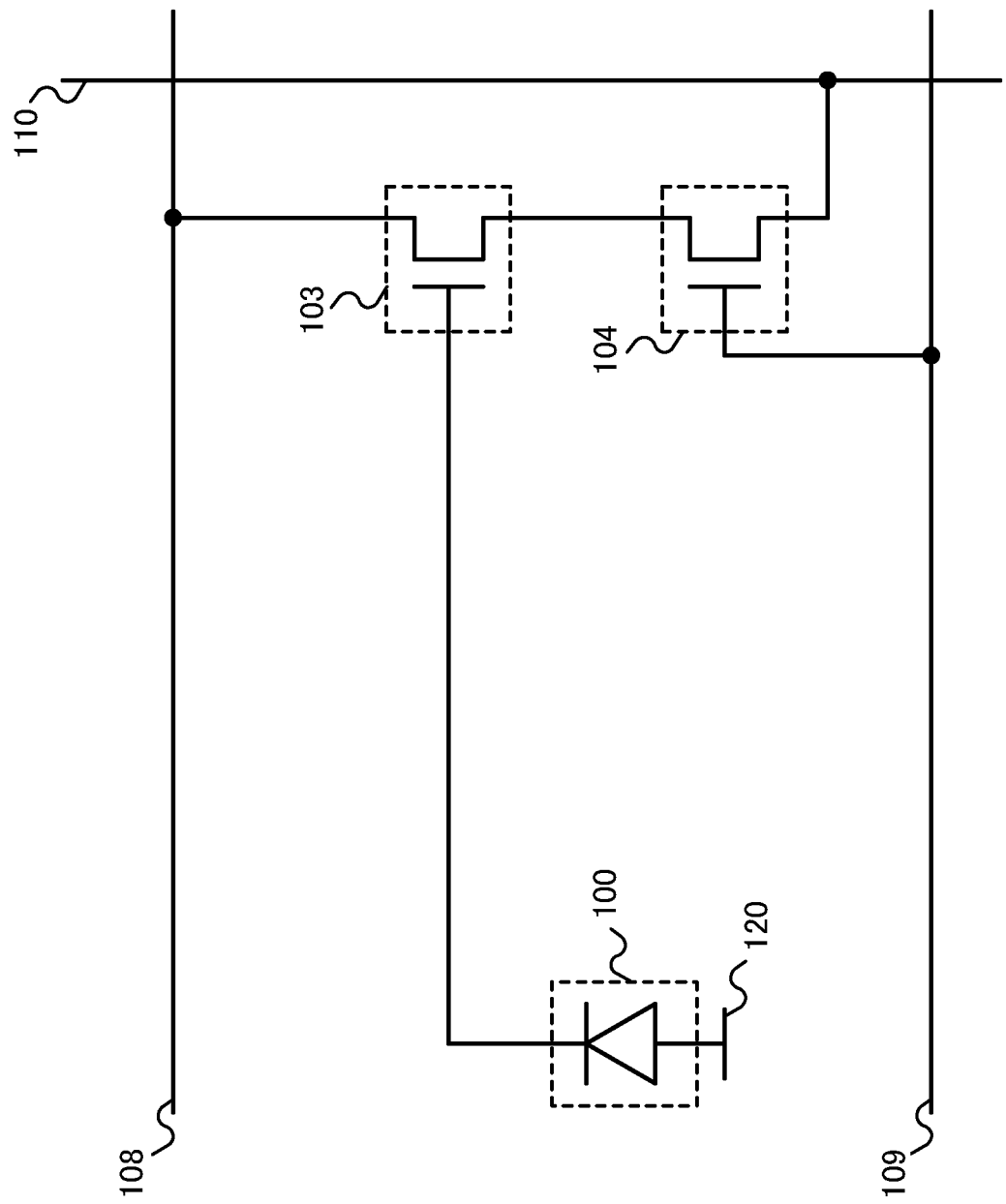
FIG. 21 illustrates an example of a circuit of a semiconductor device.

FIG. 21 is an example of the circuit diagram of the photosensor, in which the transistor 101 and the transistor 102 of FIG. 1 are omitted.

Figure 22:
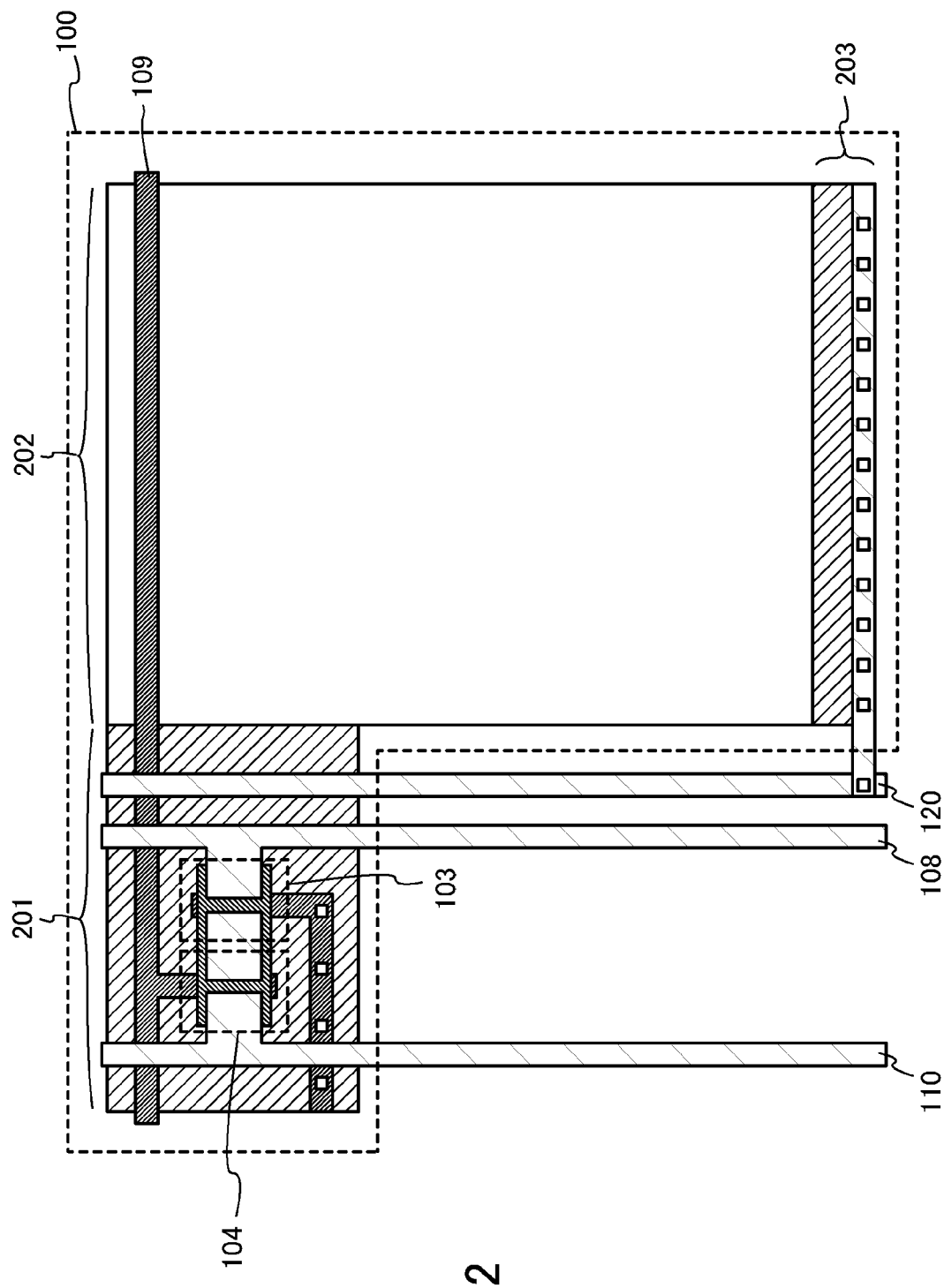
FIG. 22 illustrates an example of a layout of a semiconductor device.

FIG. 22 is an example of the layout of the circuit in FIG. 21. The light-receiving area can be increased because of a reduction in the number of elements.

Since the transistor 103 and the transistor 104 are formed to overlap with the n-region 201 of the PIN photodiode 100 in FIG. 22, the light-receiving area can be increased. The light-receiving area can also be increased when the wiring 109 or the like is made of a light-transmitting material and is formed to overlap with the i-region 202.

Figure 23:
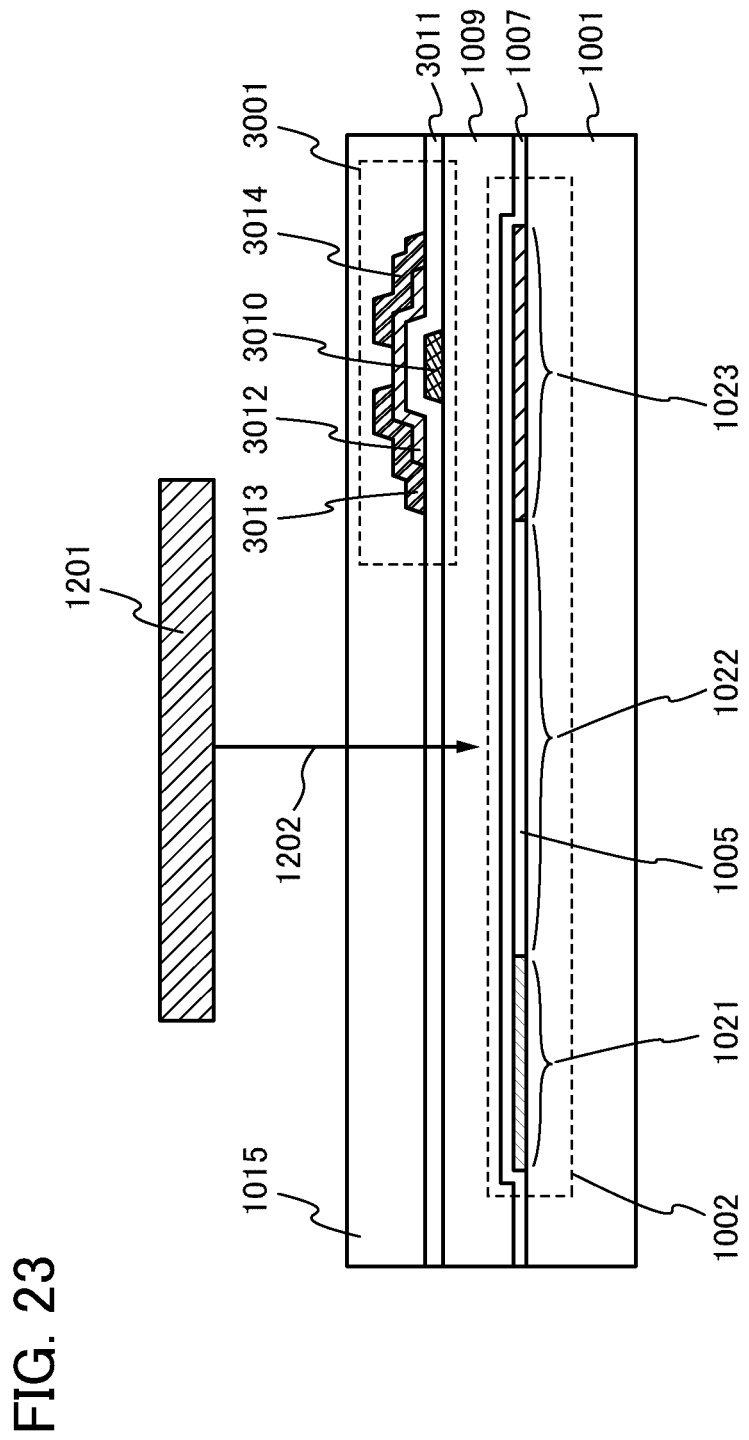
FIG. 23 illustrates an example of a cross-sectional structure of a semiconductor device.

FIG. 23 is an example of the cross-sectional view of the photosensor in FIG. 21. A transistor 3001 corresponds to the transistor 103 in FIG. 21, and is formed to overlap with the n-region 1023 of the photodiode 1002. The transistor 3001, which is a bottom-gate thin film transistor, includes a gate electrode 3010, a gate insulating film 3011, a semiconductor film 3012, an electrode 3013, and an electrode 3014. The transistor 3001 may be a top-gate transistor like the transistor 2004 illustrated in FIG. 20.

For the semiconductor film 3012, an amorphous semiconductor, a microcrystal semiconductor, a polycrystalline semiconductor, an oxide semiconductor, a single crystal semiconductor, or the like can be used. In particular, an electric signal can be amplified with high accuracy by using an oxide semiconductor to obtain a transistor with an extremely low off-current.

It is preferable that the transistor 104 in FIG. 21 be also formed over the same surface and in the same process as the transistor 103 so as to overlap with the n-region 1023. When an oxide semiconductor is used for the transistor 104, an output signal can be read with high accuracy.

This embodiment can be implemented in appropriate combination with the other embodiments.

(Embodiment 5)

This embodiment shows an example of the circuit of the semiconductor device, which is different from the example shown in the above embodiments.

FIGS. 27A to 27F are examples of the circuit of the photosensor. The layout or structure disclosed in this specification, which leads to an increase in receiving area, can be applied to these circuits.

This embodiment can be implemented in appropriate combination with the other embodiments.

(Embodiment 6)

This embodiment shows an example of the cross-sectional structure of the semiconductor device, which is different from the example shown in Embodiment 3.

Figure 24:
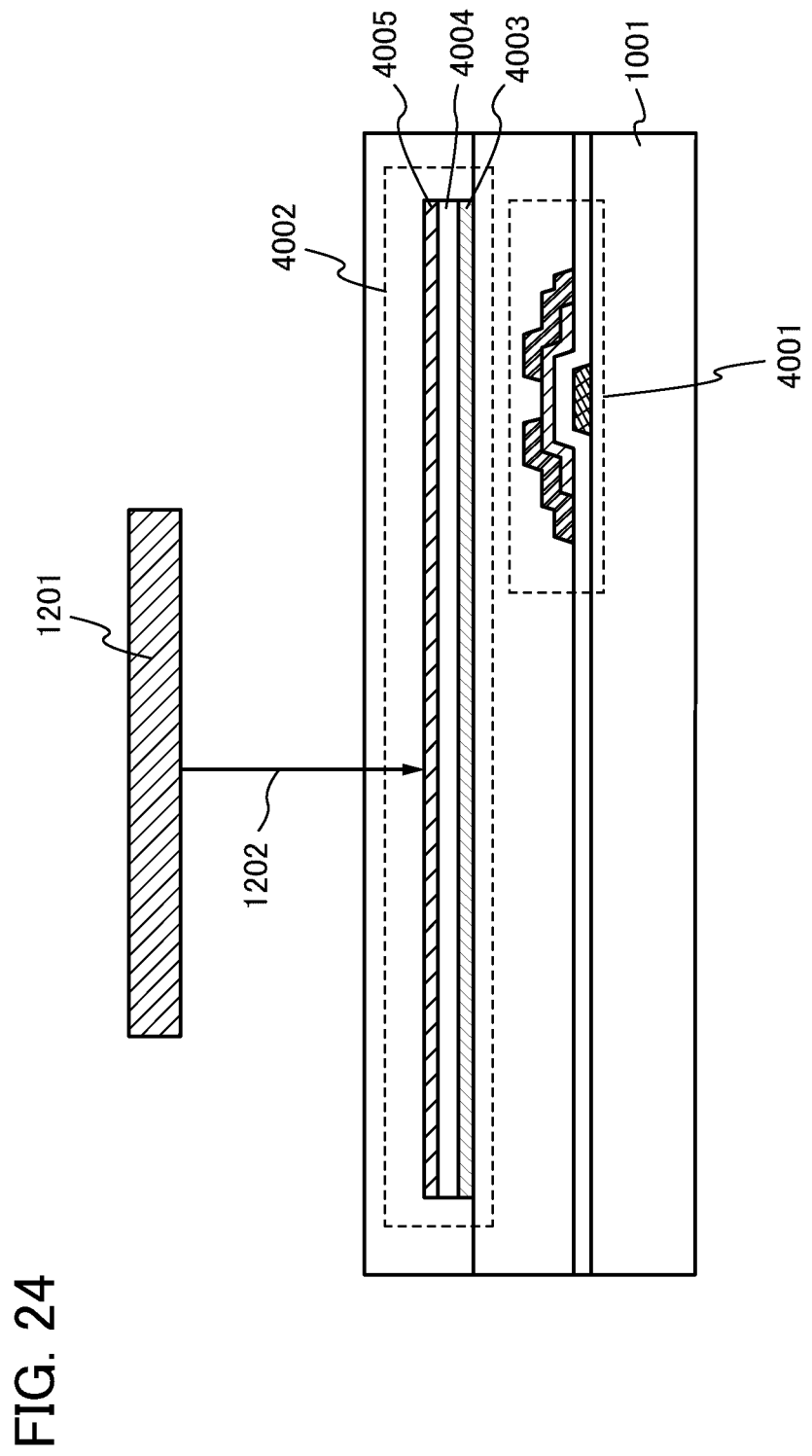
FIG. 24 illustrates an example of a cross-sectional structure of a semiconductor device.

FIG. 24 is an example of the cross-sectional view of the photosensor.

In FIG. 24, a transistor 4001 is formed over the substrate 1001 having an insulating surface, and a photodiode 4002 is formed over the transistor 4001.

The transistor 4001 can be applied to all the transistors illustrated in FIG. 1, FIG. 7, FIG. 13, FIG. 21, and FIGS. 27A to 27F. That is, all the transistors can be formed of the same material, over the same surface, and in the same process, resulting in cost reduction.

The photodiode 4002 is a vertical-junction PIN photodiode, in which an n-region 4003, an i-region 4004, and a p-region 4005 are stacked. Note that the order of stacking can be a p-region, an i-region, and an n-region. The photodiode can be a PN photodiode without the i-region 4004. For the photodiode 4002, an amorphous semiconductor, a microcrystal semiconductor, a polycrystalline semiconductor, an oxide semiconductor, a single crystal semiconductor, or the like can be used. In particular, silicon semiconductor is preferably used because the quantum efficiency of the photodiode 4002 can be improved.

The light 1202 emitted from the object to be detected 1201 enters the photodiode 4002. With such a structure, there is no element blocking the light 1202 entering the photodiode 4002; thus, a light-receiving area can be made as large as possible.

For the transistor 4001, an amorphous semiconductor, a microcrystal semiconductor, a polycrystalline semiconductor, an oxide semiconductor, a single crystal semiconductor, or the like can be used. In particular, light can be detected with high accuracy by using an oxide semiconductor to obtain a transistor with an extremely low off-current.

Note that some of the transistors included in the photosensor can be formed over a surface different from that over which the transistor 4001 is formed. The other structure is the same as that shown in Embodiment 3.

This embodiment can be implemented in appropriate combination with the other embodiments.

(Embodiment 7)

In this embodiment, an example of a semiconductor device using the photosensor will be described.

Figure 25:
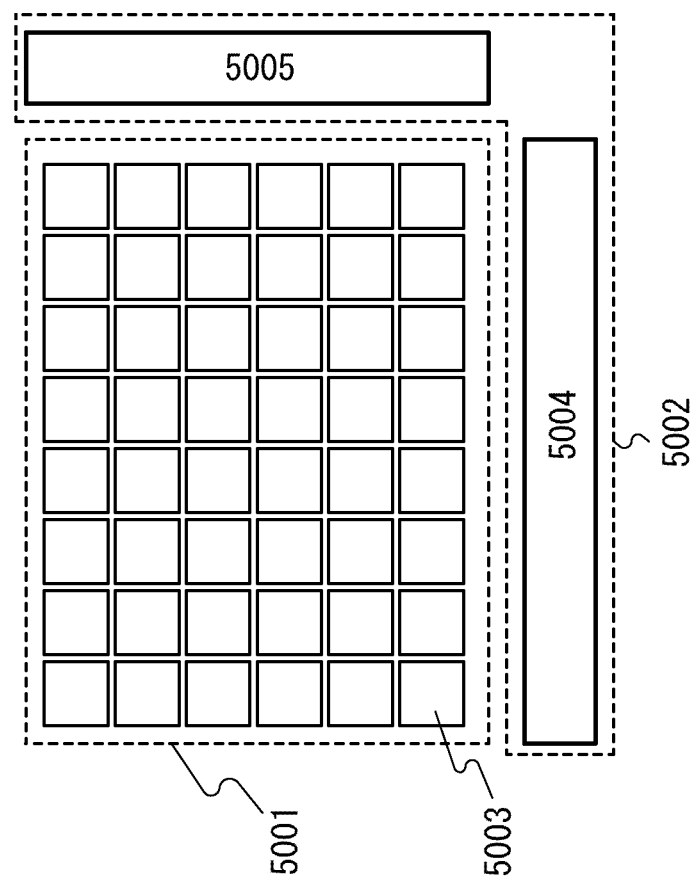
FIG. 25 illustrates an example of a semiconductor device.

FIG. 25 is an example of an image sensor provided with the photosensor. The image sensor includes a photosensor portion 5001 and a photosensor control circuit 5002. The photosensor portion 5001 includes a plurality of photosensors 5003 arranged in matrix. The photosensor control circuit 5002 includes a photosensor reading circuit 5004 and a photosensor driver circuit 5005. The area sensor is shown here, though a line sensor can also be used. The image sensor is applied to a digital still camera, a cellular phone, and the like.

The photosensor shown in the other embodiments can be applied to the photosensors 5003.

Figure 26:
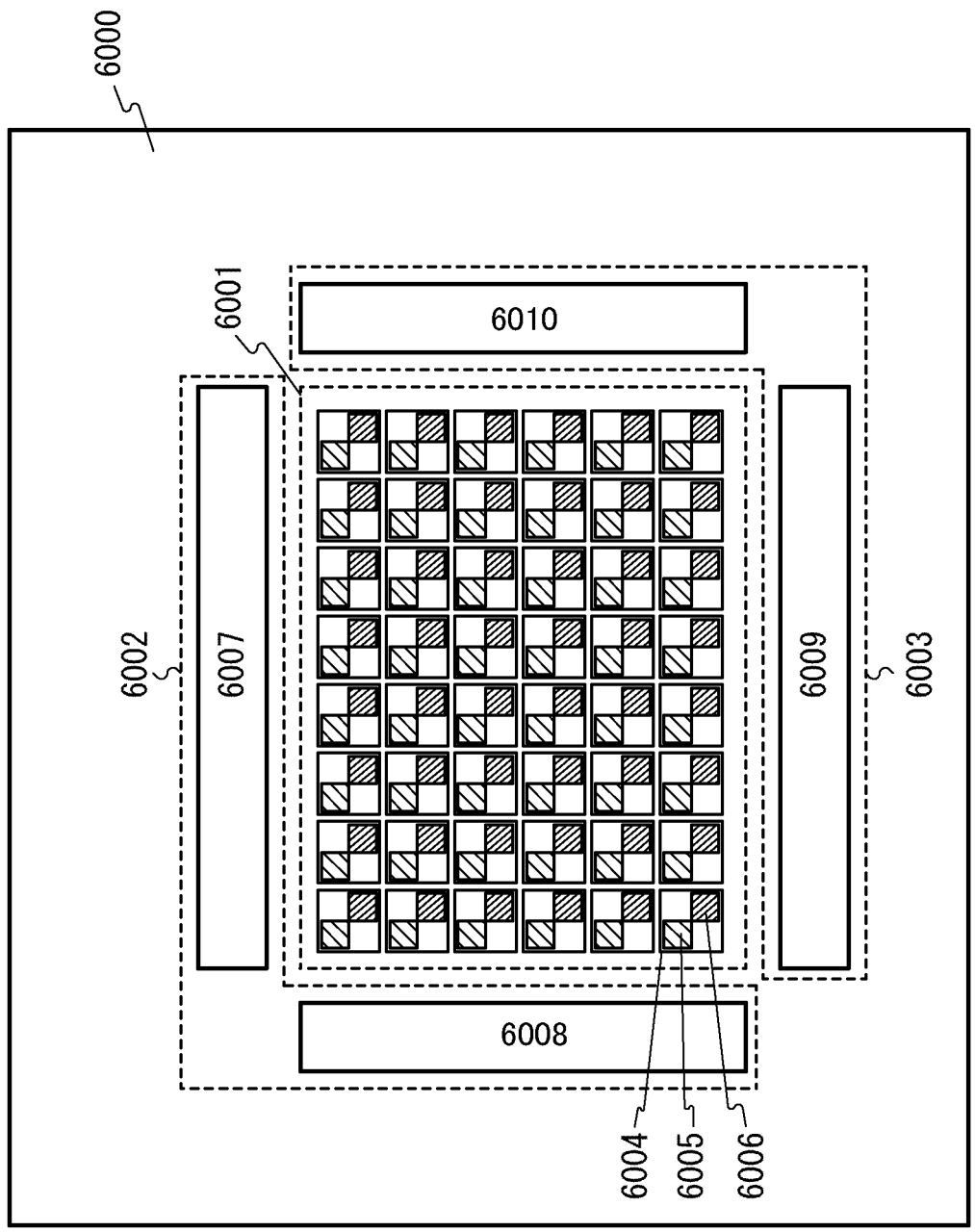
FIG. 26 illustrates an example of a semiconductor device.
Figure 27A:
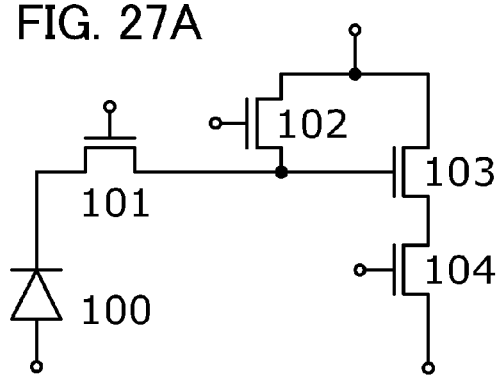
FIGS. 27A to 27F illustrate examples of a circuit of a semiconductor device.
Figure 27D:
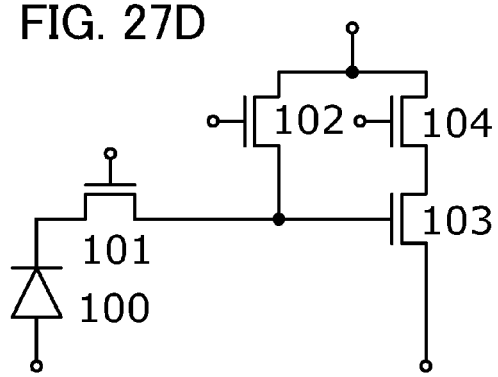
Figure 27B:
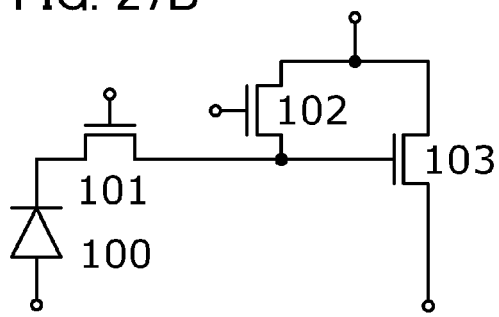
Figure 27E:
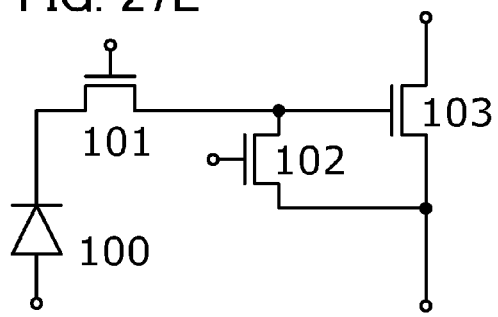
Figure 27C:
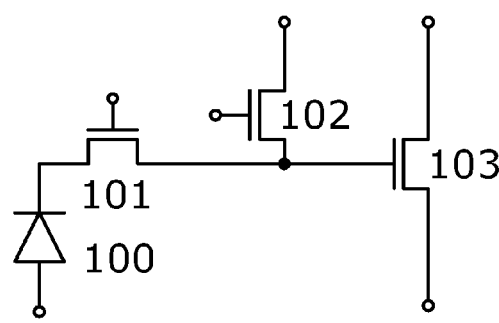
Figure 27F:
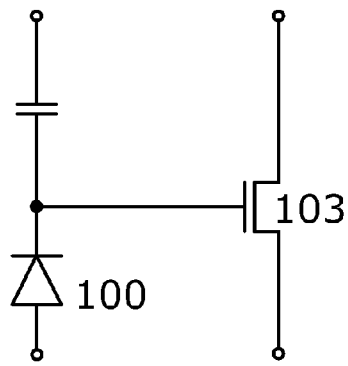

FIG. 26 is an example of a display device provided with the photosensor. A display panel 6000 includes a pixel portion 6001, a display element control circuit 6002, and a photosensor control circuit 6003. The pixel portion 6001 includes pixels 6004 arranged in matrix, each of which includes a display element 6005 and a photosensor 6006. The display element control circuit 6002 includes display element driver circuits 6007 and 6008. The photosensor control circuit 6003 includes a photosensor reading circuit 6009 and a photosensor driver circuit 6010. The display device is applied to a touch panel and the like.

The photosensor shown in the other embodiments can be applied to the photosensor 6006.

Note that the photosensor 6006 can be provided outside the pixel 6004.

As the display element 6005, a liquid crystal element, an EL element, an electrophoretic element, or the like can be used.

The display element control circuit 6002 and the photosensor control circuit 6003 can be provided outside the display panel 6000.

This embodiment can be implemented in appropriate combination with the other embodiments.

(Embodiment 8)

In this embodiment, the operation of the semiconductor device will be described.

Figure 29:
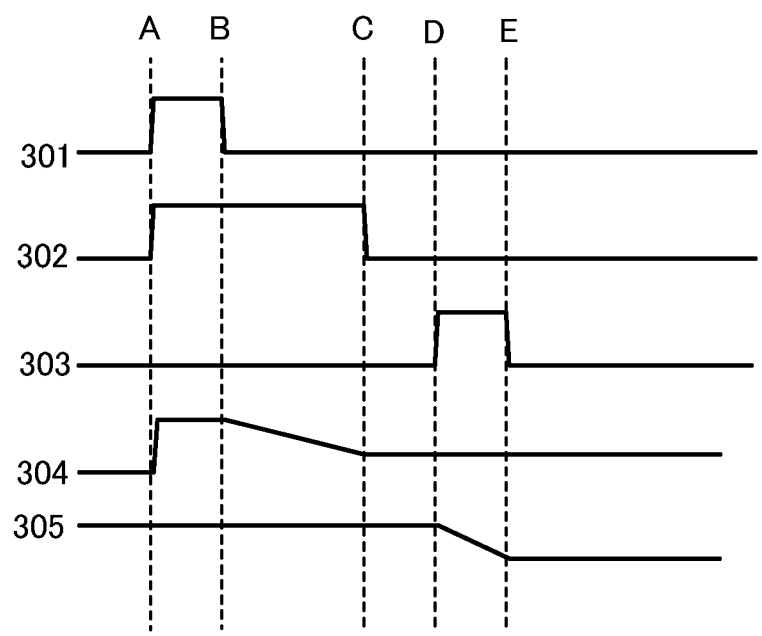
FIG. 29 is a timing chart.

The operation of the circuit in FIG. 1 will be described as an example of the operation of the photosensor. FIG. 29 is an example of a timing chart of the circuit in FIG. 1.

In FIG. 29, signals 301 to 305 respectively show the potentials of the wiring 107, the wiring 106, the wiring 109, the wiring 105, and the wiring 110 in FIG. 1. Here, the wiring 120 is assumed to be at the ground potential.

At time A, the signal 301 is set to "H (High)" and the signal 302 is set to "H" (reset operation starts), and then, the photodiode 100 is turned on and the signal 304 is set to "H".

At time B, the signal 301 is set to "L (Low)" and the signal 302 is kept at "H" (the reset operation is completed and accumulation operation starts). Then, the signal 304 starts to be lowered due to the off-current of the photodiode 100. Since the off-current of the photodiode 100 increases when light enters, the signal 304 changes depending on the amount of incident light.

At time C, the signal 302 is set to "L" (the accumulation operation is completed), whereby the signal 304 becomes constant. Here, the signal 304 is determined by the charge that has been supplied to the wiring 105 from the photodiode 100 during the accumulation operation. That is, the charge accumulated in the gate of the transistor 103 changes depending on the light entering the photodiode 100.

At time D, the signal 303 is set to "H" (selection operation starts). Then, the transistor 104 is turned on, and electrical conduction is established between the wiring 108 and the wiring 110 through the transistor 103 and the transistor 104. Thus, the signal 305 starts to be lowered. The rate at which the signal 305 is lowered depends on the current between the source and the drain of the transistor 103, namely, the amount of light that has emitted to the photodiode 100 during the accumulation operation.

At time E, the signal 303 is set to "L" (the selection operation is completed), whereby the transistor 104 is turned off and the signal 305 becomes constant. The constant value of the signal 305 changes depending on the amount of light emitted to the photodiode 100. Consequently, the amount of light entering the photodiode 100 during the accumulation operation can be found by obtaining the potential of the signal 305.

This embodiment can be implemented in appropriate combination with the other embodiments.

This application is based on Japanese Patent Application serial no. 2010-034173 filed with Japan Patent Office on Feb. 19, 2010, the entire contents of which are hereby incorporated by reference.

The invention claimed is:

1. A semiconductor device comprising:
a light-receiving element configured to convert light into an electric signal;
an insulating film over the light-receiving element;
a first transistor configured to transfer the electric signal, one of a source and a drain of the first transistor being electrically connected to an output terminal of the light-receiving element;
a second transistor configured to amplify the transferred electric signal, a gate of the second transistor being electrically connected to the other of the source and the drain of the first transistor; and
a third transistor configured to control reading of an output signal generated by the second transistor, one of a source and a drain of the third transistor being electrically connected to one of a source and a drain of the second transistor,
wherein the first transistor comprises an oxide semiconductor layer comprising the source and the drain,
wherein the entire oxide semiconductor layer is provided over the insulating film and overlaps with the insulating film,
wherein a gate of the third transistor extends over the light-receiving element, and
wherein the first transistor is provided over the second transistor with the insulating film provided therebetween.

2. A semiconductor device according to claim 1, wherein the first transistor has an off-current of 10 aA/μm or less.

3. A semiconductor device according to claim 1, wherein the light-receiving element and a channel formation region of the second transistor are made from a same semiconductor layer.

4. A semiconductor device according to claim 1, wherein the light-receiving element and the second transistor comprise silicon.

5. A semiconductor device according to claim 1, wherein the light-receiving element, a channel formation region of the second transistor, and a channel formation region of the third transistor are made from a same semiconductor layer.

6. A semiconductor device according to claim 1, further comprising a fourth transistor configured to control reset of a gate potential of the second transistor;
wherein a channel formation region of the fourth transistor is made from a same layer as a channel formation region of the first transistor.

7. A semiconductor device according to claim 1, further comprising a wiring provided over a light-receiving portion of the light-receiving element,
wherein the wiring comprises a light-transmitting material.

8. A semiconductor device according to claim 1,
wherein the insulating film is provided over the light-receiving element and the second transistor.

9. A semiconductor device according to claim 1, further comprising a wiring,
wherein the wiring comprises a light-transmitting material, is provided over the light-receiving element, and is electrically connected to the gate of the third transistor.

10. A semiconductor device comprising:
a photodiode comprising a semiconductor film provided on a surface, the semiconductor film comprising an n-region and a p-region each in contact with the surface;
an insulating film over the photodiode;
a first transistor configured to transfer an electric signal generated by the photodiode, one of a source and a drain of the first transistor being electrically connected to an output terminal of the photodiode;
a second transistor configured to amplify the transferred electric signal, a gate of the second transistor being electrically connected to the other of the source and the drain of the first transistor; and
a third transistor configured to control reading of an output signal generated by the second transistor, one of a source and a drain of the third transistor being electrically connected to one of a source and a drain of the second transistor,
wherein the first transistor comprises an oxide semiconductor layer comprising the source and the drain and overlaps with one of the n-region and the p-region of the photodiode when seen from above,
wherein the entire oxide semiconductor layer is provided over the insulating film and overlaps with the insulating film,
wherein a gate of the third transistor extends over the p-region of the semiconductor film, and
wherein the first transistor is provided over the second transistor with the insulating film provided therebetween.

11. A semiconductor device according to claim 10, wherein the n-region, the p-region and a channel formation region of the second transistor are made from the same semiconductor layer.

12. A semiconductor device according to claim 10, wherein the photodiode and the second transistor comprise silicon.

13. A semiconductor device according to claim 10, wherein the n-region, the p-region, a channel formation region of the second transistor, and a channel formation region of the third transistor are made from a same semiconductor layer.

14. A semiconductor device according to claim 10, further comprising a fourth transistor configured to control reset of a gate potential of the second transistor;
wherein a channel formation region of the fourth transistor is made from a same layer as a channel formation region of the first transistor.

15. A semiconductor device according to claim 10, further comprising a wiring provided over the photodiode,
wherein the wiring comprises a light-transmitting material.

16. A semiconductor device according to claim 10, further comprising a wiring,
wherein the photodiode is a lateral junction PIN photodiode,
wherein the semiconductor film comprises an i-region in contact with the surface, and
wherein the wiring comprises a light-transmitting material, is provided over the i-region of the semiconductor film, and is electrically connected to the gate of the third transistor.

17. A semiconductor device comprising:
a light-receiving element configured to convert light into an electric signal;
an insulating film over the light-receiving element;
a first transistor, one of a source and a drain of the first transistor being electrically connected to an output terminal of the light-receiving element;
a second transistor, a gate of the second transistor being electrically connected to the other of the source and the drain of the first transistor; and
a third transistor, one of a source and a drain of the third transistor being electrically connected to one of a source and a drain of the second transistor,
wherein the first transistor comprises an oxide semiconductor layer comprising the source and the drain,
wherein the entire oxide semiconductor layer is provided over the insulating film and overlaps with the insulating film,
wherein a gate of the third transistor extends over the light-receiving element, and
wherein the first transistor is provided over the second transistor with the insulating film provided therebetween.

18. A semiconductor device according to claim 17, wherein the first transistor has an off-current of 10 aA/µm or less.

19. A semiconductor device according to claim 17, wherein the light-receiving element and a channel formation region of the second transistor are made from a same semiconductor layer.

20. A semiconductor device according to claim 17, wherein the light-receiving element and the second transistor comprise silicon.

21. A semiconductor device according to claim 17, wherein the light-receiving element, a channel formation region of the second transistor, and a channel formation region of the third transistor are made from a same semiconductor layer.

22. A semiconductor device according to claim 17, further comprising a fourth transistor, one of a source and a drain of the fourth transistor being electrically connected to the gate of the second transistor;
wherein a channel formation region of the fourth transistor is made from a same layer as a channel formation region of the first transistor.

23. A semiconductor device according to claim 17, further comprising a wiring provided over a light-receiving portion of the light-receiving element,
wherein the wiring comprises a light-transmitting material.

24. A semiconductor device according to claim 17, further comprising a wiring,
wherein the wiring comprises a light-transmitting material, is provided over the light-receiving element, and is electrically connected to the gate of the third transistor.

25. A semiconductor device comprising:
a photodiode comprising a semiconductor film provided on a surface, the semiconductor film comprising an n-region and a p-region each in contact with the surface;
an insulating film over the photodiode;
a first transistor, one of a source and a drain of the first transistor being electrically connected to an output terminal of the photodiode;
a second transistor, a gate of the second transistor being electrically connected to the other of the source and the drain of the first transistor; and
a third transistor, one of a source and a drain of the third transistor being electrically connected to one of a source and a drain of the second transistor,
wherein the first transistor comprises an oxide semiconductor layer comprising the source and the drain and overlaps with one of the n-region and the p-region of the photodiode when seen from above,
wherein the entire oxide semiconductor layer is provided over the insulating film and overlaps with the insulating film,
wherein a gate of the third transistor extends over the p-region of the semiconductor film, and
wherein the first transistor is provided over the second transistor with the insulating film provided therebetween.

26. A semiconductor device according to claim 25, wherein the n-region, the p-region and a channel formation region of the second transistor are made from the same semiconductor layer.

27. A semiconductor device according to claim 25, wherein the photodiode and the second transistor comprise silicon.

28. A semiconductor device according to claim 25, wherein the n-region, the p-region, a channel formation region of the second transistor, and a channel formation region of the third transistor are made from a same semiconductor layer.

29. A semiconductor device according to claim 25, further comprising a fourth transistor, one of a source and a drain of the fourth transistor being electrically connected to the gate of the second transistor;
wherein a channel formation region of the fourth transistor is made from a same layer as a channel formation region of the first transistor.

30. A semiconductor device according to claim 25, further comprising a wiring provided over a light-receiving portion of the photodiode,
wherein the wiring comprises a light-transmitting material.

* * * * *